(12) United States Patent
Peeling et al.

(10) Patent No.: US 12,430,482 B1
(45) Date of Patent: Sep. 30, 2025

(54) SYSTEMS AND METHODS FOR DESIGN VALIDATION

(71) Applicant: The MathWorks, Inc., Natick, MA (US)

(72) Inventors: Paul Peeling, Ely (GB); Hannu Harkonen, Cambridge (GB)

(73) Assignee: The MathWorks, Inc., Natick, MA (US)

(*) Notice: Subject to any disclaimer, the term of this patent is extended or adjusted under 35 U.S.C. 154(b) by 926 days.

(21) Appl. No.: 17/580,573

(22) Filed: Jan. 20, 2022

Related U.S. Application Data

(60) Provisional application No. 63/199,743, filed on Jan. 21, 2021.

(51) Int. Cl.
*G06F 30/20* (2020.01)
*G06F 30/12* (2020.01)
*G06F 30/27* (2020.01)

(52) U.S. Cl.
CPC ............. *G06F 30/20* (2020.01); *G06F 30/12* (2020.01); *G06F 30/27* (2020.01)

(58) Field of Classification Search
CPC ........... G06F 30/20; G06F 30/12; G06F 30/27
See application file for complete search history.

(56) References Cited

U.S. PATENT DOCUMENTS

| | | | | |
|---|---|---|---|---|
| 2003/0097642 | A1* | 5/2003 | Arai | G06F 30/00 716/139 |
| 2006/0287749 | A1* | 12/2006 | Oyamada | G06F 30/00 700/95 |
| 2018/0373713 | A1* | 12/2018 | Alexander | G06Q 10/10 |
| 2020/0151671 | A1* | 5/2020 | Phinney | G06Q 10/103 |
| 2020/0320173 | A1* | 10/2020 | Procaccioli | G06Q 10/0639 |
| 2022/0138374 | A1* | 5/2022 | Erickson | G06K 7/10386 703/7 |
| 2022/0156417 | A1* | 5/2022 | Giordano | G06F 3/011 |

* cited by examiner

*Primary Examiner* — Brian W Wathen
(74) *Attorney, Agent, or Firm* — Finnegan, Henderson, Farabow, Garrett & Dunner, LLP

(57) ABSTRACT

Systems and methods are provided for design validation using a validation computing device and a designer computing device. The validation computing device can be configured to obtain a dataset and a record of designer interactions, provide a validation interface, and update a record of reviewer interactions. The validation interface can include a design option indicator, a justification indicator, a visualization display, and a validation control. The reviewer interactions can include rejecting a modification of a design option. The designer computing device can be configured to obtain the record of reviewer interactions; display the rejection of the modification; and provide a design interface for revising the modification or revising a justification of the modification.

21 Claims, 11 Drawing Sheets

FIG. 1B filteredTable = 1000×9 table

|   | CustAge | TmAtAddress | ResStatus |
|---|---|---|---|
| 1 | 53 | 62 | Tenant |
| 2 | 61 | 22 | Home Owner |
| 3 | 47 | 30 | Tenant |
| 4 | 50 | 75 | Home Owner |
| 5 | 68 | 56 | Home Owner |
| 6 | 65 | 13 | Home Owner |
| 7 | 34 | 32 | Home Owner |
| 8 | 50 | 57 | Other |
| 9 | 50 | 10 | Tenant |

FIG. 1C progressSummary = 5×2 table

|   |   | Count | % of Total |
|---|---|---|---|
| 1 | Total | 11 | 100 |
| 2 | Excluded | 2 | 18 |
| 3 | Included | 9 | 82 |
| 4 | Commented | 2 | 18 |
| 5 | Reviewed | 0 | 0 |

FIG. 1D

|   | Excluded | Variable Names | Comment | Validated |
|---|---|---|---|---|
| 1 | 1 | 'CustID' | "Identifier" | 1 |
| 2 | 1 | 'CustAge' | "Sensitive" | 1 |

Overview interface 200

| Design Option | Standard Code | Justification | Design | Review | Comment |
|---|---|---|---|---|---|
| Exclude PlanID | 1 | Not Medically Relevant | Y | A | |
| Exclude Postcode | 1 | | N | R | Impermissible |
| Exclude PatientAge | 3 | | N | A | |
| Exclude PatientSex | 3 | | N | A | |
| Exclude PatientWeight | 3 | | N | A | |
| Exclude HPB | 3 | | N | A | |
| Exclude Smoker | 3 | | N | A | |
| Exclude FamilyHist | 3 | Not Predictive | Y | R | Medically Relevant |
| Exclude GenVariant | 1 | | N | A | |
| Use Neural Network | 2 | Highly Predictive | Y | R | Disfavored Model |
| Use 3-Layer Network | 2 | | N | | |
| User 10-Layer Network | 3 | Highly Predictive | Y | R | Likely Overfitting |
| Use Logistic Regression | 1 | Less Predictive | N | R | Recommended Model |
| Segment on Sex | 2 | Sensitive Variable | N | R | Medically Relevant |

FIG. 2 exclusionSummaryPreview = 10×3 table

| | Excluded | Variable Names | Comm... |
|---|---|---|---|
| 1 | 0 | "CustAge" | "All tests pass" |
| 2 | 1 | "TmAtAddress" | "Fails at Chi... |
| 3 | 1 | "ResStatus" | "Fails at Info... |
| 4 | 1 | "EmpStatus" | "Fails at Info... |
| 5 | 0 | "CustIncome" | "All tests pass" |
| 6 | 0 | "TmWBank" | "" |
| 7 | 1 | "OtherCC" | "Fails at Info... |
| 8 | 1 | "AMBalance" | "Fails at Chi... |
| 9 | 1 | "UtilRate" | "Fails at Chi... |

FIG. 7B progressSummaryPreview = 4×2 table

| | | Number of Input Variables | % of Total |
|---|---|---|---|
| 1 | All variables | 10 | 100 |
| 2 | Excluded | 6 | 60 |
| 3 | Included | 4 | 40 |
| 4 | Commented | 9 | 90 |

FIG. 7C

|   | CustAge | CustIncome | TmWBank | defaultIndicator |
|---|---|---|---|---|
| 1 | 53 | 50000 | 55 | 0 |
| 2 | 61 | 52000 | 25 | 0 |
| 3 | 47 | 37000 | 61 | 0 |
| 4 | NaN | 53000 | 20 | 0 |
| 5 | 68 | 53000 | 14 | 0 |
| 6 | 65 | 48000 | 59 | 0 |
| 7 | 34 | 32000 | 26 | 1 |
| 8 | 50 | 51000 | 33 | 0 |
| 9 | 50 | 52000 | 25 | 1 |

FIG. 7D

Filter by Univariate Analysis
filteredTable, exclusionTable = Subtable of someTable with 2 variables excluded

Select data

| | | | |
|---|---|---|---|
| Input table | someTable | | |
| Test criteria | myCriteria | Response | status |

Analyse data variables

| Exclude | Var name | Comment |
|---|---|---|
| [ ] | TmAtAddress | |
| [ ] | ResStatus | |
| [ ] | EmpStatus | |
| [ ] | CustIncome | |

| | | | | |
|---|---|---|---|---|
| Summary stats | Info value | 0.001 | Red | Some diagnostic |
| Histogram | AccuracyRatio | 0.002 | Amber | Some diagnostic |
| Screening data | AUROC | 0.12321 | Red | ... |
| Screening visuals | Entropy | 0.34543 | Red | ... |
| Overall progress | Gini | 0.65456 | Red | ... |
| | Percent missing | 10 | Green | ... |
| | Overall status | | Red | Fails InfoValue, AccuracyRatio [...] |

Visualization Interface 850

SYSTEMS AND METHODS FOR DESIGN VALIDATION

CROSS-REFERENCE TO RELATED APPLICATIONS

This application claims the benefit of U.S. Provisional Application No. 63/199,743, filed Jan. 21, 2021, which is incorporated herein by reference in its entirety.

SUMMARY

The disclosed systems and methods relate to a system for design validation. The system for design validation includes a designer computing device and a validation computing device. A user interacts with the designer computing device to modify design options. A record of user interactions, including the modifications, can be reviewed by a reviewer using the validation computing device. The validation computing device can be configured to enable the reviewer to review each modification together with the context in which the user selected the modification.

The disclosed embodiments include a system for design validation. The system can include a validation computing device and a design computing device. The validation computing device can be configured to obtain a dataset and a record of user interactions. The record of user interactions can including modifications of options for a design. The design options can be specified by a rule set that implements a standard. The modifications of the design options can include a first modification of a first design option and a first justification of the first modification. The validation computing device can be further configured to provide a validation interface. The validation interface can include, at least in part, a design option indicator configured to display the first modification, a justification indicator configured to display the first justification, a visualization display that depicts a first visualization of the dataset corresponding to the first design option, and a validation control that enables a first rejection of the first modification. The validation computing device can be further configured to store, in a record of reviewer interactions, the first rejection. The design computing device can be configured to obtain the record of reviewer interactions and display the first rejection. The design computing device can be further configured to provide a design interface for revising the first modification or revising the first justification of the first modification.

In some embodiments, the dataset can include tabular data, image data, or natural language processing data. In some embodiments, the dataset can include a tabular dataset, and the first design option can include including, transforming, or excluding a row or column of the tabular dataset. In some embodiments, the first design option can include modifying outlier values or replacing missing values in the dataset, or applying a transformation to at least a portion of the dataset. In some embodiments, the design can include a model for prediction, inference, classification, or detection. The first design option can include selecting portions of the dataset as inputs to the model; or a model type, model architecture, or model segmentation. In some embodiments, the design can include a program. The first design option can include an assertion that a program assumption is satisfied, the program assumption being dependent on the dataset. In some embodiments, the record of reviewer interactions can include the record of user interactions. The validation computing device can be configured to store the first rejection in association with the first modification.

The disclosed embodiments include an additional system for design validation. The system can include a designer computing device and a validation computing device. The designer computing device can be configured to obtain a dataset and a rule set that implements a standard. The designer computing device can be further configured to provide a design interface. The design interface can be configured to enable modifications of options for a design. These design options can be specified by the rule set. The design interface can include, at least in part, a selection control, a justification control, and a visualization display. The selection control can be configured to enable a first modification of a first design option. The justification control can be configured to enable provision of a first justification for the first modification. The visualization display can depicts a first visualization of the dataset corresponding to the first design option. The designer computing device can store, in a record of user interactions, the first modification and the first justification. The validation computing device can be configured to obtain the record of user interactions and display a validation interface. The validation interface can include a depiction of the first modification, the first justification, and the first visualization. The validation interface can further include a validation control configured to enable a first rejection of the first modification. The validation computing device can be configured to store, in a record of reviewer interactions, the first rejection.

In some embodiments, the designer computing device can be further configured to predetermine the first modification by applying the rule set to the dataset. The selection control can be configured to enable, as the first modification, acceptance or rejection of the predetermined first modification. In some embodiments, the designer computing device can be further configured to predetermine the first justification by applying the rule set to the dataset. The justification control can be configured to enable, as the provision of the first justification, acceptance or replacement of the predetermined first justification. In some embodiments, the justification control can be configured to enable a selection of an alternative justification, as a replacement of the predetermined first justification, from a set of predetermined justifications specified by the rule set. In some embodiments, the design includes a model for prediction, inference, classification, or detection. The model can be trained using, at least in part, training data generated from the dataset. The rule set can specify design options for modifying the dataset or the model.

The disclosed embodiments include a design validation method. The design validation method can include operations of obtaining a dataset and a rule set that implements a standard, developing a design, and deploying the design. Development of the design can include modifying, by at least one first user, design options specified by the rule set using, at least in part, a design graphical user interface. The design graphical user interface can display, for a first design option and a set of currently selected design options: a first visualization corresponding to the first design option, a control for modifying the first design option, and a control for providing a first justification for a first modification of the first design option. The first visualization can depict at least one of: a portion of the dataset as modified by the first subset of the selected design options; descriptive information for the portion of the dataset; or a first application of the design to the dataset. The first application of the design can be as specified by a second subset of the selected design options. Development of the design can further include validating, by at least one second user, the modifications of the design options using, at least in part, a validation graphical user interface. The validation graphical interface can display, for the first design option: the first visualization; the first justification; and a validation control for accepting or rejecting the first modification. Development of the design can further include reverting, by a first one of the at least one first user, the first modification when the first modification is rejected by the at least one second user. Development of the design can further include deploying the design.

In some embodiments, a second one of the at least one first user can modify the design options in a first order. The modified design options can be displayed by the validation graphical user interface to the at least one second user in the first order. In some embodiments, the method can further include obtaining a category for each of the design options based, at least in part, on the rule set. The development can further include displaying, to the at least one second user, an overview graphical user interface that depicts a subset of the design options, the subset of the design options corresponding to a subset of the categories. In some embodiments, the method can further include interacting, by a first one of the at least one second user, with the overview graphical user interface to select the first modification for validation. The validation control for accepting or rejecting the first modification can be displayed by the validation graphical user interface in response to the selection of the first modification for validation. In some embodiments, the validation graphical user interface can display, for the first design option, a control for selecting an alternative design option. The method can further include an operation of selecting, by a first one of the at least one second user and using the control for selecting the alternative design option, the alternative design option. The method can further include an operation of displaying, by the validation graphical user interface, a third visualization corresponding to a third design option. The third visualization can depict a second portion of the dataset as modified by at least the alternative design option, descriptive information for the second portion of the dataset; or a third application of the design to the dataset as specified by at least the alternative design option. The method can further include an operation of displaying, by an overview graphical user interface, a categorization of the third design option based at least in part on the alternative design option. In some embodiments, the method further comprises reviewing a design after deployment of the design. Such reviewing can include obtaining a second dataset. Such reviewing can further include reviewing, by a third user, the modifications of the design options using, at least in part, the validation graphical user interface. The validation graphical user interface can display, for the first design option, a second visualization corresponding to the first design option. The second visualization can depict at least one of a portion of the second dataset as modified by a third subset of the selected design options; descriptive information for the portion of the second dataset; or an application of the design, as specified by a fourth subset of the selected design options, to the second dataset as modified by the third subset of the selected design options. In some embodiments, the development can further include, during a first development stage, modifying, using the design graphical user interface, data preprocessing design options and validating, using the validation graphical user interface, the modifications of the data preprocessing design options. In some embodiments, the development can further include, after validation of the modifications of the data preprocessing design options, during a second development stage, modifying, using the design graphical user interface, design input options and validating, using the validation graphical user interface, the modifications of the design input options. In some embodiments, the design can include a model for prediction, inference, classification, or detection. The development can further include, during a third development stage, modifying, using the design graphical user interface, design options concerning model type, model architecture, or model segmentation and validating, using the validation graphical user interface, the modifications of the design options concerning model type, model architecture, or model segmentation. In some embodiments, deploying the model includes automatically generating code implementing the design and executing or interpreting the code.

It is to be understood that both the foregoing general description and the following detailed description are exemplary and explanatory only and are not restrictive of the disclosed embodiments, as claimed.

BRIEF DESCRIPTION OF THE DRAWINGS

The drawings are not necessarily to scale or exhaustive. Instead, emphasis is generally placed upon illustrating the principles of the embodiments described herein. The accompanying drawings, which are incorporated in and constitute a part of this specification, illustrate several embodiments consistent with the disclosure and, together with the description, serve to explain the principles of the disclosure. In the drawings:

FIGS. 1B to 1D depict exemplary outputs of the exemplary user interface of FIG. 1A, consistent with disclosed embodiments.

FIG. 2 depicts an exemplary overview interface for validating design option modifications, consistent with disclosed embodiments.

FIGS. 7B to 7D depict exemplary outputs of the exemplary user interface of FIG. 7A, consistent with disclosed embodiments.

FIG. 8 depicts a further exemplary user interface for modifying design options, consistent with disclosed embodiments.

DETAILED DESCRIPTION

Figure 1A:
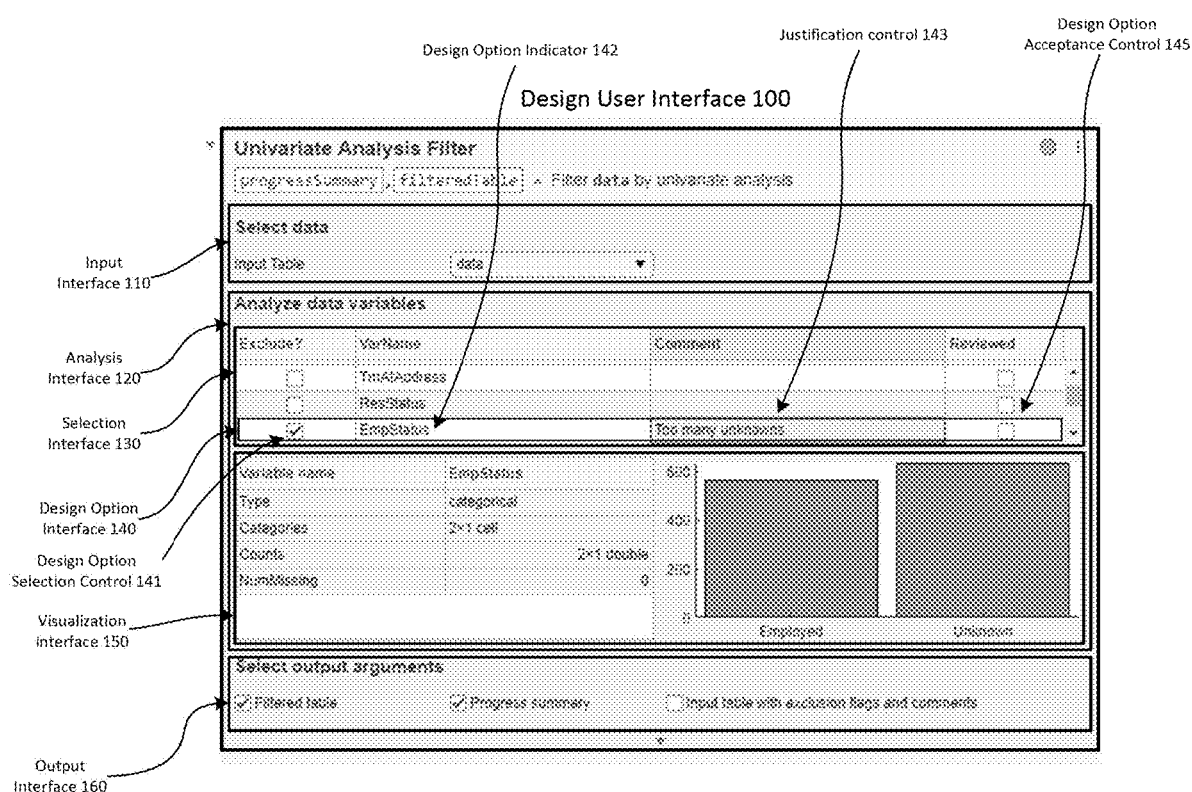
FIG. 1A depicts an exemplary user interface for modifying design options, consistent with disclosed embodiments.

Reference will now be made in detail to exemplary embodiments, discussed with regards to the accompanying drawings. In some instances, the same reference numbers will be used throughout the drawings and the following description to refer to the same or like parts. Unless otherwise defined, technical and/or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. For example, unless otherwise indicated, method steps disclosed in the figures can be rearranged, combined, or divided without departing from the envisioned embodiments. Similarly, additional steps may be added, or steps may be removed without departing from the envisioned embodiments. Thus, the materials, methods, and examples are illustrative only and are not intended to be necessarily limiting.

Complicated designs, such as computer code or models (which may be implemented using computer code), play an increasingly important role in decision-making. Decisions such as whether to extend credit, offer parole, provide medical treatment, and the like can hinge on the output of such designs. Mechanical systems of similar importance, such as automobiles, airplanes, medical devices, or the like, may be subjected to extensive design control processes or guidelines. Such design control processes or guidelines can stipulate that such systems be described in terms of requirements and subject to validation and verification efforts to ensure that the system satisfies the requirements. But existing approaches fail to provide a similar degree of control over the development of designs.

The development of a design can involve many choices. Using a predictive model as an example, development of the model can involve selection of inputs to the model, selection of a model type, model architecture, and perhaps model segmentation. Each of these choices constitutes a potential source of error. In some instances, the predictive model may overfit the input data used to train the model and may poorly generalize to new data. Or the model may amplify latent biases and prejudice in the input data, encoding invidious discrimination against vulnerable minorities into the output of the model. In some instances, a user designing the model (e.g., a "designer") may simply err in developing the model, excluding an important input, or selecting an inappropriate model type.

Standards can be used to provide a degree of protection against common sources of error or bias. As described in greater detail herein, such standards can describe characteristics of a suitable design in a particular area or for a particular use. However, determining whether a design adheres to a standard can be a complicated and time-consuming process. A user (e.g., a "reviewer") may review individual design options selected by a designer for conformity with the standard. But the designer may select design options based on contextual information unavailable to the reviewer. Lacking such contextual information, the reviewer may struggle to understand the designer's selections. The reviewer may improperly accept or reject the designer's design option selections, potentially slowing the design process and reducing the effectiveness of such review.

The disclosed embodiments provide user interfaces that enable a designer to chose design options in accordance with rules that implement a standard. The rules can be determined in advance, separating the implementation of the standard from the development of the design. The design options available to the designer can depend on the rules and the data used to develop the design. The disclosed embodiments further provide user interfaces that enable a reviewer to review the design options chosen by the designer. Such a validation interface can enable the reviewer to review the selected design options in a context similar to (or the same as) the context in which the designer selected the design options. Consistent with disclosed embodiments, a separation of roles can be maintained between the designer and the reviewer. The designer can select design choices and provide justifications for these choices. The reviewer can validate the design choices and provide comments. The actions of the designer and reviewer can be tracked to ensure accountability and increase the likelihood that the final design conforms to the standard. In this manner, the disclosed embodiments can enable an improved verification and validation process for designs that protects against the introduction of errors and biases in the development of a design, without hindering the design process or undermining the effectiveness of such verification and validation.

Types of Designs

In some embodiments, a design can be a model for use in prediction, inference, or classification. The disclosed embodiments are not limited to models including any particular type or number of input values, or any particular type or number of output values.

A prediction model can, consistent with disclosed embodiments, receive an input dataset including one or more input values and generate, based on the dataset, an output dataset including one or more output values. As a non-limiting example, a prediction model may be configured to receive an input dataset including patient information for a cancer patient (e.g., numeric patient age, sex, height or weight data; Boolean family history of cancer data; categorical cancer type, patient genetic variant type, or cancer stage data; or other suitable patient data). The prediction model can be configured to predict a survival time of the cancer patient.

An inferential model can, consistent with disclosed embodiments, receive an input dataset including one or more input values. The input values can include independent and dependent variables. The inferential model can be configured to determine a relationship between the independent and dependent variables. As a non-limiting example, the inferential model can be configured to receive an input dataset including patient information and patient survival data. The inferential model can determine a relationship between the patient survival data and the variables included in the patient information.

A classification model can be configured to receive an input dataset and generate, based on the input dataset, an output dataset including one or more categories or labels describing the input dataset. As a non-limiting example, the classification model can be configured to receive prisoner information (e.g., age, sex, criminal history, offense, or the like) and output whether the prisoner should be granted parole. As a further non-limiting example, a classification model can receive an image as input and output a classification of an object in the image. As an additional non-limiting example, a natural language processing model can receive an audio file or stream as an input and perform automatic summarization, translation, named entity recognition, relationship extraction, sentiment analysis, speech recognition, topic segmentation, or other natural language processing tasks using the audio file or stream.

In some embodiments, a classification model can serve as a detection model. As a non-limiting example, a classification model can receive an input comprising one or more financial transactions and output an indication of whether the transactions are fraudulent.

In some embodiments, the design can be computer code (e.g., Ada, Basic, C, C++, C#, FORTRAN, MATLAB, machine code, assembly code, GPU code, and HDL code, such as VHDL, Verilog, SystemC, or netlists, among other suitable computer code). In some embodiments, the standard (e.g., MISRA C, or the like) can attempt to facilitate software development by enhancing computer code safety, security, portability, and reliability. Rules can be developed for implementing this standard. These rules can be applied to computer code to identify locations where the code is potentially inconsistent with the standard (e.g., using a code checking tool, such as a static analysis tool, a dynamic analysis tool, or the like). Such locations can constitute design options. As described herein, in some embodiments these design options can be categorized according to a risk level.

A user interface can be configured to enable the designer to select an input dataset and step through the design options. In some instances, the input dataset can be test data. For example, when the design concerns a control system (e.g., an embedded controller, or other embedded system), the test data can be historical or simulated sensor data for the control system. As an additional example, when the design concerns an application configured to handle application requests, the test data can be historical or simulated application requests. By considering the potential violations in the context of such expected test data, the designer can determine whether a program assumption highlighted by the code checking tool is satisfied.

As a non-limiting example, a rule implementing the MISRA C standard may require that the right-hand operand of a shift operator lie within the range zero to one less than the width in bits of the type of the left-hand operand of the shift operator. A code checking tool can determine that computer code includes a shift operator having an integer left-hand operand and an integer right-hand operand. The value of the right-hand operand may depend on the input data. In this manner, the code can assume that the value of the integer right-hand operand is less than the width—1 of the integer left-hand operand. The code checking tool may identify this code assumption as a design option. The reviewer can review the design and determine, based on a visualization of the input data or the results of applying the design to the data (e.g., by inputting the data to a computing device executing the code, or the like), whether the code assumption is satisfied.

As non-limiting example, an input value in an automatic gain system can be left-shifted a number of times dependent on an output value of the system to ensure that the output value remains within a certain range. By reviewing test input values, the designer can determine that the input value will remain in a range such that the left-shift operand does not violate the rule. As described herein, a user interface can be configured to display a visualization corresponding to the design option. The visualization may depict, for example, minima and maxima of the test input data. The designer can then select the design option to assert that the program assumption is satisfied. A reviewer can later validate the assumption by reviewing the selection together with the contextual information displayed in the visualization. The reviewer can decide whether to accept or reject the selection of the design option. In some embodiments, the designer may (e.g., if required by the set of rules implementing the standard) provide a justification for selecting the design option to indicate that the code assumption was satisfied. In various embodiments, the reviewer may provide comments in response. If the reviewer does not accept the selection, the designer may be obligated to modify the code or provide further justification.

Data Preprocessing Design Options

Design options can include data preprocessing options, in accordance with disclosed embodiments. Such data preprocessing options can include selection or deselection (referred to herein as "modification") of a design option (e.g., a design option to perform an operation on an input dataset). The disclosed embodiments are not limited to any particular set of such operations. In some embodiments, the operation can include transforming at least a portion of the input dataset. Such a transformation can include at least one of scaling (e.g., normalization, or the like), offsetting or recentering (e.g., subtracting a value from the selected portion of the dataset), replacing values (e.g., replacing missing values in the selected portion of the input dataset with a default value or a value dependent on the other values of the selected portion of the input dataset, such as an average, max, min, or the like of the other values of the selected portion of the input dataset), coding values into categorical variables (e.g., coding a patient weight into "underweight," "normal weight," "overweight", "obese", or the like), or other suitable data preprocessing operations. In various embodiments, the data preprocessing operation can include applying spatial filters to image data, adding noise to data, or other preprocessing options.

Data Input Design Options

Design options can include data input options, in accordance with disclosed embodiments. A data input option can include a selection of a portion of the input dataset (e.g., the entire input dataset, one or more variable in the input dataset, one or more rows or columns of a tabular dataset, one or more observations satisfying a criterion, a segment of an input image, or the like). Consistent with disclosed embodiments, the portion of the input dataset can be selected for inclusion (or exclusion) as an input to a model. The portion of the input dataset selected can depend on the nature of the input dataset. When the input dataset is tabular data, a data input option can include the selection of a row or column of the input dataset for inclusion (or exclusion) as an input to the design. As a non-limiting example, a designer can select, from a tabular dataset, a column of race or ethnicity information for exclusion from a predictive model. This column would then not be used by the predictive model. A data input option can include the selection of a variable of the input dataset for inclusion (or exclusion) as an input to the design.

As a non-limiting example, a designer can select, from a key-value dataset, a postcode variable storing the postcode of a potential city employee. The designer may select the variable for inclusion as an input to a classification model used for hiring when the city has a residency requirement. A data input option can include selection of a portion of an image for inclusion (or exclusion) as an input to the design. As a non-limiting example, a medical image (e.g., an x-ray) can include alignment marks. The portion of the medical image within the alignment marks can be relevant, while the portion outside the alignment marks can be extraneous. A designer can select as an input to a diagnostic model the portion of the medical image within the alignment marks (e.g., by selecting a function or option that crops the medical image to exclude the portion outside the alignment marks). A data input option can include the selection of values of a row, column, variable, or the like that satisfy a criterion (e.g., fall within a range) for inclusion (or exclusion) as an input to the design. As a non-limiting example, a designer can select, from a database of test scores and demographic student information, only those records corresponding to students within an age range.

A data input option can include a selection of a feature for inclusion (or exclusion) as an input into the design. In some instances, the feature can be a portion of the input dataset. In various instances, a feature can be generated from a portion of the input dataset. The disclosed embodiments are not limited to any particular feature engineering method. In some embodiments, a feature can be generated using a dimensionality reduction technique (e.g., independent component analysis, latent semantic analysis, principal component analysis, an autoencoder, or another suitable method). In various embodiments, the features can be generated automatically (e.g., using multi-relational decision tree learning, deep feature synthesis, or other suitable techniques) or at least partially manually (e.g., coded by a data scientist, domain expert, or other user). In various embodiments, the option to select the feature for inclusion or exclusion can arise from the selection of other design options.

As a non-limiting example, a designer may be developing a predictive model of heart attack risk. The input dataset to this model can be a tabular patient information dataset including a patient height column and a patient weight column. During a preliminary data exploration stage of the development of this model, the designer can select the patient height column and a patient weight column for inclusion into the model. As a result of this selection, these columns can be included in the preliminary analysis of the data. As a result of the preliminary analysis of the data, the designer may create a Body Mass Index ("BMI") feature and then select the BMI feature as an additional or alternative input for inclusion in the model. Accordingly, in this non-limiting example, the designer can select design input options in two stages: first, the initial selection of the height and weight columns for use in the preliminary data exploration, and second, the selection of the BMI feature for use in the predictive model.

As an additional non-limiting example, a designer may be developing a phoneme classification model for speech recognition. The input to this model can be audio data. During a preliminary data exploration stage of the development of this model, the designer can determine that signal-to-noise ratios, sound durations, matches to sound templates, and similar features are predictive of phonemes in the audio data. The results of these determinations (e.g., noise ratio values, sound duration values, the presence or absence of a match to a sound template, etc.) can be selected as features for inclusion in the model.

Design Architecture Options

Consistent with disclosed embodiments, when the design includes a model, the design options can include at least one of model type, model architecture, or model segmentation options. A model type option can include a selection of a type of model to use in the design. The disclosed embodiments are not limited to a selection of any particular model type. In some embodiments, a selected model type can be a supervised model, an unsupervised model, a reinforcement learning model, or other suitable model. In various embodiments the selected model type can be a regression model (e.g., linear, logistic, polynomial, kernel, or the like), decision tree model, ensemble model (e.g., random forest model, or other ensemble model), support vector machine, clustering model (e.g., k-nearest neighbors model, or another clustering model), neural network model (e.g., deep learning, recurrent, generative adversarial network, convolutional neural network, or other suitable neural network), probability density estimation model, clustering model (e.g., k-means, density-based spatial clustering of applications with noise, hierarchical density-based spatial clustering of applications with noise, Gaussian mixture model, or the like), dimensionality reduction model, or other suitable model type.

Consistent with disclosed embodiments, given a model type selection, the design options can include model architecture options. An opportunity to select a model architecture option may arise from or depend upon the selection of a model type. The disclosed embodiments are not limited to selection of particular model architecture options, or selection of model architecture options for a particular model type. As a non-limiting example of model architecture options, when a neural network model is selected, a model architecture option can be a parameter (e.g., number of layers, connections between layers, activation function, loss function, or the like), or a hyperparameter (e.g., batch size, learning rate, initialization method, or the like). As an additional non-limiting example of model architecture options, when a clustering model is selected, a model architecture option can be the number of clusters, the distance metric (e.g., Euclidean, Manhattan, Minkowski, or the like) used for computing the clusters, or the like.

Consistent with disclosed embodiments, the design options can include model segmentation options. In some instances, a model segmentation option can include selection of a segmentation variable, column, or the like. As a non-limiting example, a designer may be designing a classification model for detecting pedestrians based on image data from multiple image sensors (e.g., for a self-driving car application). The designer can select, as a model segmentation option, to segment the model into two segments. The segmentation could be performed based on an average brightness of an image. A "low-light" model could be developed for use with images having less that a certain average brightness and a "high-light" model could be developed for use with images having more than a certain brightness. As a further non-limiting example, a designer may be designing a recidivism prediction model for parole determinations. The designer can select, as a model segmentation option, to segment the model into two segments. The segmentation could be performed based on the sex of the offender. A "male" model could be developed for predicting recidivism in male offenders and a "female" model could be developed for predicting recidivism in female offenders.

As can be appreciated, a selection to segment the model can result in additional selections of additional model types and model architectures, as the model type and model architecture can differ between segments. In various instances, a model segmentation option can include selection of an algorithm for segmenting or clustering the data (e.g., k-means, cluster analysis conjoint analysis, decision trees, Chi-square automatic interaction detection, principal component or factor analysis, mixture models, structural equation modeling, a neural network classification model, or other methods of automatically or semi-automatically segmenting the data).

Design Options can be Selected for Consistency with a Standard

In accordance with disclosed embodiments, a designer can interact with the user interface to select design options consistent with a standard. In some instances, the standard can be promulgated by a judicial or regulatory body (e.g., a consent decree imposed by a court, a government regulator, a trade association, an industry standards group, an internal risk management board of a company, or a similar regulatory body). The standard may be intended to guide or govern the development of designs in a particular area or field. As a non-limiting example, the Federal Reserve has provided the SR 11-7 Guidance on Model Risk Management. These guidelines describe the establishment of a model governance framework for models that apply statistical, economic, financial, or mathematical theories, techniques, and assumptions to process an input dataset into one or more quantitative estimates. Such models can be used for analyzing business strategies, informing business decisions, identifying and measuring risks, valuing exposures, instruments or positions, conducting stress testing, assessing adequacy of capital, managing client assets, measuring compliance with internal limits, maintaining the formal control apparatus of the bank, or meeting financial or regulatory reporting requirements and issuing public disclosures. As an additional non-limiting example, the Food and Drug Administration is developing guidelines for model-informed drug development. Establishing model credibility through the verification and validation of the model may be an important part of model-informed drug development. As a further non-limiting example of a standard, a court (e.g., through a consent decree) or a government regulator may require mortgage rates be offered without discriminatory effect.

A Rule Set can Implement the Standard

Consistent with disclosed embodiments, a rule set can implement the standard. In some embodiments, the standard may describe high-level requirements for a design (e.g., legal, nondiscrimination, traceability, or other requirements), while the rule set can specify design options consistent with the standard. To continue a prior non-limiting example, when a standard requires offering mortgage rates without discriminatory effect, a rule set can restrict modification of design options pertaining to certain borrower information (e.g., race, sex, ethnicity, or the like). For example, the rule set may prevent a designer from modifying a data input option such that a portion of the input dataset storing such borrower information is included into a design (e.g., by selecting a design option to include the portion or de-selected a design option to exclude the portion). As may be appreciated from the foregoing, a rule set implementing the standard may not be unique: a standard could be implemented by multiple differing rule sets.

In some embodiments, the rule set can be created with knowledge of the input dataset (e.g., with knowledge of the schema of the input dataset, or the like). As a non-limiting example, a rule set can be created with the knowledge that certain portions of the input dataset store legally protected characteristics of individuals (e.g., race, sex, ethnicity, or other characteristics that cannot be the basis for discrimination in certain contexts). The rules can be created to specify that such portions cannot be selected for inclusion in the model. In various embodiments, the rule set can be created with additional knowledge of the intended use of the model (e.g., to recommend an employment, treatment, or financial decision, or the like that cannot be provided on a discriminatory basis). To continue the previous example, based on the knowledge of the schema and the intended use of the model, the rules can be created to specify that the portions of the input dataset that store legally protected characteristics cannot be selected for inclusion in the model.

In some embodiments, at least some of the rules can be created without knowledge of the dataset. Such rules may be created for application to a variety of models and datasets. For example, the rules can be created to specify that legally protected characteristics of individuals cannot be included as inputs to a model. In such embodiments, either a developer of the rules or a developer of the design can map the rules to the schema of the input dataset (e.g., by indicating that a column of a tabular dataset is governed by a particular rule in the rule set). For example, a risk management officer of a financial institution may configure a rule to specify that a portion of the input dataset cannot be selected as an input to a model because the risk management officer knows that portion stores legally protected characteristics of individuals. As an additional example, rules can specify that inputs that fail predetermined statistical tests (e.g., tests based on the information content or entropy content of the input, chi-squared tests of the distribution of the input with regards to other inputs, or the like) cannot be included as inputs to a model.

A Rule Set can Specify Whether or how Design Options are Displayed by a User Interface Consistent with disclosed embodiments, when a designer interacts with a user interface to develop a design, a rule set can specify whether the user interface displays a particular design option. In some instances, a rule set can specify that only certain design options are displayed. To continue a prior example, when borrower information includes variables, columns, or the like that store borrower race information and borrower financial information, the rule set can specify that no design option for including the race information is displayed. In contrast, the rule set can specify that design options for including variables, columns, or the like storing financial information are displayed.

Consistent with disclosed embodiments, when a designer interacts with a user interface to develop a design, a rule set can specify how the user interface displays a design option. In some instances, a rule set can specify that certain design options are displayed pre-selected. To continue the prior example, the rule set can specify that a design option for excluding a portion of the input dataset be displayed pre-selected, when that portion stores borrower race information. In contrast, in some instances, the rule set can specify that a design option for excluding a portion of the input dataset is not displayed pre-selected (or is displayed with a default selection value), when that portion stores financial information.

Consistent with disclosed embodiments, when a designer interacts with a user interface to develop a design, a rule set can specify whether a designer can interact with a displayed selection of a design option. To continue the prior example, the rule set can specify that a design option for excluding a portion of the input dataset be non-interactive, when that portion stores borrower race information. In contrast, in some instances, the rule set can specify that a design option for excluding a portion of the input dataset is interactive, when that portion stores financial information. Thus, a designer can select (or deselect, depending on the default behavior of the design user interface with which the designer is interacting) the data input option to exclude or include the portion storing financial information as an input to the model.

As may be appreciated from the forgoing, design options may be specified as any combination of "opt-in" or "opt-out". In some instances, a user interface for selecting design options can display both a first data input option that, if selected, excludes a first portion of the input dataset from being an input to the model and a second data input design option that, if selected includes a second portion of the input dataset as an input to the model. Furthermore, though described for convenience with regards to data input options, a rule set may similarly specify model type options, model architecture options, or model segment options. As a non-limiting example, a standard may require that the effect on an output value of modifying an input value (or combination of input values) be explainable or justifiable. To continue this example, a rule set implementing this standard may restrict model types to those in which the relationship between model inputs and outputs has a clear real-world basis. For example, the rule set may require selection of a linear regression model, or may exclude from possible selection neural network models, support vector machine models, dimensionality reduction models, or other models in which the relationship between inputs and outputs may be difficult to understand. As a similar non-limiting example, the rule set may restrict a model architecture of a neural network model to a certain connectivity or number of layers.

In some embodiments, different entities can be associated with the standard, the rule set, and the design. In some instances, a first party (e.g., a government regulator or court, a standard-setting organization, or the like) can promulgate the standard, a second party (e.g., a risk management officer of a financial institution, a requirements engineer associated with a design project, or the like) can create the rules, and a third party (e.g., a data scientist or business analyst of the financial institution, a development engineer associated with the design project, or the like) can select the design options in accordance with the rules while developing the design. In some instances, a fourth party (e.g., a compliance officer of the financial institution, a validation or verification engineer associated with the design project, or the like) can review and validate (or reject) the third party's selections of design options.

Risk Categories

In some embodiments, the rules may assign design options to varying categories. This assignment could reflect a perceived risk that modifying the design option could cause the design to violate the standard. In some embodiments, whether a design option is displayed, pre-selected, or interactive, as described above, may depend on the category assigned by the rules to the design option.

In some embodiments, the rules can specify "high-risk", "medium-risk", and "low-risk categories of design options. Consistent with disclosed embodiments, the "high-risk" category may include design options perceived likely to result (if modified) in a design that would violate the standard (e.g., like selecting, in the previous example, race as an input to a model for assigning mortgage rates). In various embodiments, a "high-risk" design option may not be displayed by the design user interface, may be displayed preselected, or may be displayed preselected and not interactive.

Consistent with disclosed embodiments, a "medium-risk" category may include design options perceived potentially likely to result (if modified) in a design that would violate the standard. In various embodiments, a "medium-risk" design option may be displayed by the design user interface and may be interactive but may be displayed preselected. To continue the previous example, a borrower demographic information can include address information. The rules may specify that a data input option of selecting "address" as a model input falls within the "medium-risk" category, as minority homeowners historically faced invidious discrimination on the basis of address. But address information can also be used to automatically appraise a home and assess the potential of the home for appreciation. Given this legitimate use for the "address" information, the data input option to select the "address" column for inclusion in the model may be categorized by the rules as "medium-risk".

Consistent with disclosed embodiments, a "low-risk" category may include design options perceived unlikely to result (if modified) in a design that would violate the standard. In various embodiments, a "low-risk" design option may be displayed by a design user interface, may be interactive, and may not be displayed preselected. To continue the previous example, the tabular dataset of borrower demographic and financial information may include an "asset value" column. Given the legitimate need for collateral to back a mortgage loan, a design option to select the "asset value" column as an input to a model for assigning mortgage rates may be categorized by the rules as "low-risk".

In some embodiments, the rules can specify a value-based or performance-based criterion for determining a category for a design option. For example, a rule may specify that a data input decision to include a portion of an input dataset is "high-risk" when the more than an upper threshold proportion of the values in the portion are missing; "medium-risk" when the proportion of missing values is between the upper threshold and a lower threshold; and "low-risk" when the proportion of missing values is less than the lower threshold. Similarly, a rule may specify that a feature is "high-risk" when the feature has an importance value lower than a lower threshold; "medium-risk" when the importance value is between the lower threshold and an upper threshold, and "low-risk" when the importance values is greater than the upper threshold. The disclosed embodiments are not limited to any particular method of determining an importance value. In some embodiments, an importance value for a feature can be determined using one or more statistical tests (e.g., Pearson's correlation, linear discriminant analysis, ANOVA, chi-square test, or the like) of the correlation of the feature values with a desired outcome. In various embodiments, the importance value for a feature can be determined using one or more statistical tests of the information content of the feature.

As may be appreciated, the disclosed embodiments are not limited to the "high-risk", "medium-risk", and "low-risk" schema described herein. Consistent with disclosed embodiments, the rules may specify other categorizations, including a larger or smaller number of risk categories.

User-Provided Justifications

In some embodiments, a designer may be prompted to provide a justification for modification of a design option. A justification can be any textual or graphical indication of why the designer chose to modify (e.g., select or deselect) a design option. In some embodiments, when a data input option concerns inclusion of a portion of the input dataset into a design, a corresponding justification could concern the portion of the dataset. As a non-limiting example, a portion of the input dataset may be a necessary part of a model (e.g., a sectoral model of the economy may require input data from all of the sectors modeled, even when the data for a sector is noisy or highly variable). A corresponding justification could indicate the necessity of including this portion of the input dataset. As a further non-limiting example, the accuracy ratio associated with a feature may be less than a threshold value, but the feature may still be relevant. A corresponding justification could indicate the relevance of the feature. Similar justifications can be provided when a data input option concerns exclusion of a portion of the input dataset in a design. For example, inclusion of a portion of an input data could be inconsistent with a standard. A corresponding justification could be "sensitive data." A feature may offer a limited improvement in the performance of a model. A corresponding justification could be "poorly predictive".

Consistent with disclosed embodiments, when a designer interacts with a user interface to modify a design option, the designer may be required by the user interface to provide a corresponding justification. The disclosed embodiments are not limited to any particular method of enforcing, by the user interface, the requirement to select the corresponding justification. In some embodiments, when the designer interacts with the user interface in a session to select one or more design options, the user interface can be configured to prevent the designer from exiting the session (or from completing or finalizing the design, or from completing or finalizing a step in the design process, such as one of the steps described below with regards to FIG.) until all required justifications are provided. In various embodiments, when the designer interacts with the user interface to select design option(s) and then build the design in accordance with the selected design option(s), the user interface can be configured to prevent building of the design (or saving of the built design) until any required justifications are provided. In some embodiments, the user interface can be configured to prevent the designer from selecting another design option until all required justifications are entered for previously selected design options. In various embodiments, when a selection requires a corresponding justification, the user interface can be configured to activate a control for entering the justification (or de-activate other controls in the user interface, such as controls for selecting other design options or navigating to other design options, or the like). In some embodiments, the user interface may be configured to keep the activated control active until the required justification is provided.

Consistent with disclosed embodiments, a set of rules implementing a standard can specify the design options that require justification when modified. In some embodiments, all modifications may require justification. In various embodiments, only some modifications may require justification. In some embodiments, the rules may specify which design option modifications require justification. Consistent with disclosed embodiments, when the rules specify risk categories for design options, the risk category of a design option may determine whether modification of the design option requires a corresponding justification. For example, deselection of a "high-risk" design option (e.g., de-selecting a data input design option that would otherwise exclude a portion of an input dataset including protected demographic data, or the like) might require a justification. In contrast, in this example, selection of a "low-risk" design option (e.g., selecting a logistic model for estimating the probability that a credit card user will default in the next two months, or the like) may not require a justification.

Consistent with disclosed embodiments, a set of rules implementing a standard can specify a set of justifications. When required to justify modification of a design option, a designer can select a justification from the set. In some embodiments, a predetermined justification can be provided for a design option. In some embodiments, data input options can be provided to the designer pre-selected (or de-selected) based on the application of the set of rules to the input dataset (e.g., a data input option to exclude a sensitive portion of the data could be provided pre-selected). In various embodiments, a predetermined justification can be provided for a design option based on the application of the rules to the input dataset. For example, a rule may specify that columns having more than 5% missing values are excluded from the input dataset. The input dataset may include a column storing transaction information (e.g., including transaction time) and purchaser characteristics. The design may be intended to predict a transaction time given purchaser characteristics. But 10% of the rows may have a missing transaction time. Accordingly, the rule may automatically select the column of transaction times for exclusion from the design. The rule may automatically provide the justification "Too many missing values." However, the designer, interacting with a design user interface, can revert the selection. In this example, the designer can provide an alternative justification as a replacement for the predetermined justification. The alternative justification can state why the column times are retained (e.g., "Required model input," or the like). In various embodiments, the replacement justification can be selected from a set specified by the set of rules. In some embodiments, the replacement justification can be entered free form by the designer into a text entry control, or the like. In some embodiments, the designer can enter an alternative justification without changing the modification of the design option (e.g., when the designer agrees that a portion of the dataset should be excluded form being an input to a design but disagrees with the predetermined reason for such exclusion).

In some embodiments, a subset of the justifications can be specific to the category of design option. In some instances, a first subset of the justifications can be specific to data input options. More limited first subsets can be specific to different types of data input options (e.g., different sets of justifications for numeric data, categorical data, images, alphanumeric or textual data, or the like). In various instances, a second subset of the justifications can be specific to model types. More limited second subsets can be specific to different model types (e.g., different sets of justifications for regression models, decision tree models, ensemble models, support vector machines, k-nearest neighbors models, neural network models, probability density estimation models, clustering models, dimensionality reduction model, or other suitable model types). In various instances, a third subset of the justifications can be specific to model architectures. Such justifications may be specific to a particular combination of model type and model architecture. As non-limiting examples, one set of justifications can address the number or the connectivity of layers of a neural network model (e.g., "model overfitting data", "model underfitting data", "insufficient training data", "class imbalance", or the like), and other set of justifications can address the number of clusters for clustering models ("X clusters identified by observation of data", "Existence of X clusters known a-priori", "Inclusion of additional clusters does not improve performance of model", or the like). As described herein, the disclosed embodiments are not limited to any particular justifications. In some embodiments, a rule set can be developed, including the justifications, for a specific input dataset and the development of a specific design.

The disclosed embodiments are not limited to embodiments in which the set of rules specifies the justifications. In some embodiments, a default set of justifications can be associated with a user interface. In some instances, a programming environment or an application can be configured to provide a user interface for modifying design options (and the corresponding interface for reviewing such modifications), as described herein. A set of justifications can be provided by the programming environment or the application (e.g., as a built-in set of the justifications, through user configuration files, or other suitable methods).

Record of User Interactions and Intermediate Datasets

As may be appreciated from the foregoing, a modification of a design option may affect the suitability of another design option. Accordingly, depending on the order in which a designer selects design options, the designer may modify different design options. As a non-limiting example, a designer may select a design option to replace missing values with imputed values in rows of a tabular dataset. The designer may subsequently determine that a neural network model satisfies a performance criterion and select a design option to include the neural network model in the design. However, in this hypothetical example, had the designer selected a design option to remove rows including the missing values (rather than replace the missing values with imputed values), the neural network may not have satisfied the performance criterion and the designer may have selected a design option for including a different model type in the design.

Accordingly, consistent with disclosed embodiments, the design options modified, and optionally the order in which such options were modified, can be stored (e.g., in a record of designer interactions, or the like). Additionally or alternatively, in some embodiments, an intermediate dataset can be associated with each selection of a design option. The intermediate dataset corresponding to a particular design option can reflect the state of the dataset before the selection of that particular design option (e.g., the input dataset as modified by the design options selected prior to that particular design option). To continue the prior example, the intermediate dataset corresponding to the selection of the neural network model for inclusion in the design may include the imputed values in place of the missing values.

Visualizations

In some embodiments, when the designer interacts with a user interface to modify design options, the user interface can present visualizations to support the designer's decision. A visualization can correspond to a design option and may depict contextual information concerning the design options. Such contextual information can include input data values, descriptive statistics for input data values (e.g., univariate statistics, extreme values, number of missing values, values of metrics that characterize information content, or the like), results of applying a design to input data, performance of a model, output of a model, architecture of a model, or the like. Examples of contextual information are provided herein with regards to FIGS. 1A, 7A, and 8.

Consistent with disclosed embodiments, a visualization corresponding to a design option can depict a portion of the input dataset (e.g., as modified by previously selected design options), descriptive information for the portion of this modified dataset, an application of a design (e.g., as specified by previously selected design options) to this modified dataset, or the like. Consistent with disclosed embodiments, a visualization corresponding to a design option can depend on previously selected design options. In some embodiments, a visualization can depend on the input dataset. Accordingly, by using the intermediate dataset corresponding to a design option (e.g., the input dataset as modified by the previously selected design options, or the like) the visualization can be based on the appropriate data. In various embodiments, a visualization can depend on the design. The visualization can depict the application of the design (as specified by the selected model type, model architecture, model segmentation, or other relevant design options in a second subset of the selected design options) to the input dataset (as modified by the selected data input options, or other relevant design options in a first subset of the selected design options). The visualization can depict a performance of a model (e.g., an $R^2$ value of a regression model; an accuracy, receiver operating characteristic, precision; recall; or confusion matrix of a classification model; a mean squared error of a prediction model; or other similar performance metric(s) appropriate to the selected model type); the output of the model given the modified input dataset; the architecture of the model; or other similar visualizations.

As a non-limiting example, a designer can interact with a user interface to select a model type option for including a neural network in the design. The user interface can then display to the designer a model architecture option specifying the number of layers in the neural network. In this non-limiting example, the user interface can also display a visualization depicting the different architectures or depicting the performance of the neural network model with the different numbers of layers. As an additional example, a designer can interact with the user interface to select a model type option for including a k-means clustering model in the design. The user interface can then display to the designer a model architecture option specifying the number of clusters to use in the k-means model. Together with the model architecture option, the user interface can display the modified dataset with the clusters labeled or display a performance measure for the clustering.

First Exemplary Design User Interface

FIG. 1A depicts an exemplary design user interface 100, consistent with disclosed embodiments. Design user interface 100 can be displayed by a computing device (e.g., a smartphone, tablet, laptop, or other mobile computing device; a desktop or workstation, a terminal; or another suitable computing device). The computing device can enable a designer to interact with design user interface 100. The disclosed embodiments are not limited to any particular method of interaction between a designer and design user interface 100. In various embodiments, the computing device can be configured to enable the designer to interact with design user interface 100 using a mouse, trackpad, trackball, pointing stick, touchpad, touchscreen, or similar interface; or an auditory interface (e.g., a natural language processing interface, or the like).

Design user interface 100 can be configured to enable the designer to modify design options, in accordance with disclosed embodiments. Design user interface 100 can be configured to display visualizations corresponding to the design options together with the design options, in some embodiments. The visualizations can provide contextual information to assist the designer in modifying the design options. The designer can interact with design user interface 100 to modify design options. In some embodiments, the designer can interact with design user interface 100 to provide justifications for the modification of design options. Consistent with disclosed embodiments, the computing device providing design user interface 100 can be configured to store or provide for storage by another computing device (such direct or indirect storage referred to herein as "store") modifications of the design options made by the designer. In some embodiments, the computing device can store intermediate results of the selections (e.g., intermediate datasets, or the like). In various embodiments, the computing device can store a record of the designer's interactions with design user interface 100.

Consistent with disclosed embodiments, a validation interface (not shown in FIG. 1A) can be configured to enable a reviewer, different from the designer, to validate the designer's modifications. The validation interface can be provided by the same computing device that displayed design user interface 100, or by another computing device. The computing device that provides the validation interface can be configured to obtain (e.g., retrieve from a memory, receive from another computing device, or the like) the stored modifications made by the designer. In some embodiments, the computing device that provides the validation interface can be configured to obtain at least one of the intermediate results or the record of the designer's interactions. Consistent with disclosed embodiments, the validation interface can be the same or similar to design user interface 100, as described herein. The validation interface can be configured to display the design option, the designer's modification of the design option, and similar or the same contextual information as displayed by the design user interface 100. The reviewer can interact with the validation interface to validate the designer's modifications of the design options. In this manner, the reviewer can have the proper context for determining whether the designer's design option modifications are valid.

As a non-limiting example, a validation interface can be implemented by enabling a reviewer to interact in a limited fashion with design user interface 100. For example, design user interface 100 can permit a reviewer to select a design option, thereby causing design user interface 100 to display contextual information for that design option. The design user interface 100 can permit the reviewer to accept a modification of that design option by interacting with design option acceptance control 145. However, the design user interface 100 can prohibit the reviewer from interacting with design option selection control 141 or justification control 143. In this manner, the reviewer can step through the design options and visualize the supporting contextual data, without being able to change the modifications of the design options.

This description refers to a single designer, for ease of explanation, but multiple persons can act as the designer. For example, multiple people can interact with one or more computing devices through one or more user interfaces to modify design options for a design. Likewise, this description refers to a single reviewer, but multiple persons can act as the reviewer. For example, multiple people can interact with one or more computing devices through one or more user interfaces to review the design option modifications for the design. In some instances, a person can act as the designer with regards to some design options and as the reviewer with regards to other design options. For example, a first person can select a first set of design options for a design and provide the first set to a second person for review. The second person can select a second set of design options for the design and provide the second set to the first person for review. In some embodiments, the user interface can be configured to facilitate such dual roles. For example, the user interface can include (as shown in FIG. 1A) both a design option selection control (e.g., design option selection control 141) and a validation control (e.g., design option acceptance control 145). The user interface can be configured to track whether a person is acting as the designer or reviewer with respect to a particular design option and enable the appropriate design option selection or validation control.

Consistent with disclosed embodiments, design user interface 100 can include an input interface 110 for selecting an input dataset. The input interface can include one or more controls for selecting the input data. As depicted in FIG. 1A, input interface 110 can include a drop-down menu for selecting the input dataset. Selecting the input dataset using input interface 110 can cause the computing device displaying design user interface 100 to obtain the input dataset (e.g., by requesting it from another computing device, retrieving it from a memory, or executing or interpreting a program to generate the input dataset). In the non-limiting example depicted in FIG. 1A, design user interface 100 is configured to select a tabular input dataset titled "data".

Consistent with disclosed embodiments, design user interface 100 can include an analysis interface 120. Analysis interface 120 can display a selection interface 130 and at least one visualization (e.g., in visualization interface 150). Selection interface 130 can enable a designer to select a design option. In some embodiments, selection interface 130 can provide a set of design options and the designer can select from among the provided design options. In various embodiments, selection interface 130 can offer a single design option for selection. The at least one visualization (e.g., in visualization interface 150) can display contextual information enabling the designer to decide whether to modify (e.g., select, or de-select) the design option. In this manner, the designer can interact with design user interface 100 to review design options quickly and conveniently.

Consistent with disclosed embodiments, selection interface 130 can display one or more controls for selecting a design option. As depicted in FIG. 1A, selection interface 130 can include a scrolling list box that displays each of at least one design option interface (e.g., design option interface 140) as a list box entry. In some embodiments, each design option interface can include an indicator identifying the design option (e.g., design option indicator 142) and at least one control. The at least one control can include a control enabling the designer to select (or de-select) the design option (e.g., design option selection control 141).

As depicted in FIG. 1A, the design option selection control 141 can be a checkbox. Selecting the checkbox can exclude the employment status column (identified by a text field including the value "EmpStatus") in the tabular dataset from use in the design. In some embodiments, the at least one control can include a control enabling provision of a justification (e.g., by the designer) for the modification of the design option (e.g., the selection or deselection of the design option, or the like) (e.g., justification control 143).

As depicted in FIG. 1A, justification control 143 can be a text field. In this non-limiting example, a designer can enter free-form text into justification control 143. In various embodiments, as described herein, a designer can select from predetermined justifications, which may be specified by a set of rules that implement a standard. In some embodiments, design user interface 100 can be used by a reviewer to validate the design option selection. In some such embodiments, each design option interface can include a control enabling a reviewer to accept (or reject) the modification of the design option (e.g., design option acceptance control 145).

As depicted in FIG. 1A, the design option acceptance control 145 can be a checkbox. Selecting the checkbox can cause the computing device displaying design user interface 100 to store (or provide to another computing system for storage, or the like) an indication that a reviewer has reviewed and accepted the modification of the design option. As described herein, the stored indication can be provided to the designer to prompt the designer to revise the modification or provide additional justifications. In some embodiments, reviewing and accepting the modification can be divided into two states: a "reviewed" control can indicate that a reviewer has reviewed the modification, and an "accepted" control can indicate that the reviewer has accepted the selection (or a "rejected" control can indicate that the reviewer has rejected the modification). In some such embodiments, each design option interface can include a control enabling a reviewer to provide a comment regarding the acceptance (or rejection) of the modification of the design option (not depicted in FIG. 1A). For example, when design user interface 100 also serves as the validation interface, design user interface 100 could include an additional column in selection interface 130. The additional column could include a text entry control similar to justification control 143. In such embodiments, design user interface 100 could permit a reviewer (but not a designer) to add comments into this column using the text entry control. Examples of potential reviewer comments are depicted in FIG. 2.

Consistent with disclosed embodiments, visualization interface 150 can display at least one visualization corresponding to a design option selectable using analysis interface 120. This visualization can depict contextual information. A designer may rely upon this contextual information in deciding whether to modify the corresponding design option (e.g., include or exclude input data from a design). The contextual information can include at least one of a portion of the input dataset (or the modified version of the input dataset), descriptive information (e.g., univariate or statistics, extreme values, representative values, or the like) for the input dataset (or a modified version of the input dataset), or the application of the design to the input dataset (or a modified version of the input dataset). In various embodiments, as described herein, displaying the application of the design to the input data set can include, when the design includes a model, depicting a performance of the model; the output of the model given the modified input dataset; the architecture of the model; or other similar visualizations.

In some embodiments, a visualization displayed in visualization interface 150 can depend upon previously selected design options. Such previously selected design options can modify the input dataset (e.g., by adding or removing portions of the data, overwriting values, or the like). Similarly, the design may depend on any previously selected model type, model architecture, or model segmentation choices. Accordingly, in some embodiments, the displayed visualizations can depend on a modified version of the input data (which can reflect previously selected design options).

As depicted in FIG. 1A, visualization interface 150 can include visualizations corresponding to the design option having the selected justification control (e.g., justification control 143). In this non-limiting example, the design option concerns the exclusion of the variable "EmpStatus" (e.g., employment status) from use in the design. A first visualization depicts descriptive information (in this non-limiting example variable name, type, categories, counts and number of missing values). A second visualization depicts a distribution of values for the categories of "EmpStatus" in the modified dataset. As can be seen from the second visualization, the majority of the rows in the column "EmpStatus" of the tabular data "data" have the value "Unknown". The designer has consequently chosen to select "EmpStatus" for exclusion from the design and entered the justification "Too many unknowns".

In some embodiments, a reviewer can interact with a validation interface to review the decision to select "EmpStatus" for exclusion from the design. In some embodiments, the validation interface can display a subset of the contextual information (e.g., input dataset values, descriptive information, application of the design to the input dataset, model performance, model output, model architecture, or the like) displayed in visualization interface 150. To continue the prior example, the validation interface can display the descriptive information displayed in the first visualization (e.g., variable name, type, categories, counts, NumMissing) or the distribution information depicted in the second visualization. In some embodiments, the validation interface can present the same information as displayed in visualization interface 150 in the same manner (e.g., as a table when the information was displayed in visualization interface 150 as a table, as a chart when the information was displayed in visualization interface 150 as chart, or the like) and arrangement (e.g., with the same rows and columns in the same order when the information was displayed in visualization interface 150 as table, with the same axis, scale, orientation, and labeling when the information was displayed in visualization interface 150 as a chart, or the like). In various embodiments, the same information as displayed in visualization interface 150 can be displayed in a differing manner (e.g., a chart as opposed to a table, or a table as opposed to a chart, or a different type of chart, or the like) or a differing arrangement (e.g., a differing labeling or row and column order for a table, differing axis, orientation, or labeling for a chart, or the like). In various embodiments, different contextual information can be displayed. For example, additional information concerning the design option could be displayed or less information concerning the design option could be displayed (e.g., only one of the two visualizations depicted in visualization interface 150, or only some of the rows depicted in the first visualization, or the like). In some embodiments, a validation interface could afford the reviewer the option to explore the data (e.g., by creating additional visualizations or drilling down to the modified or intermediate dataset). In this manner, the reviewer can have the proper context (e.g., contextual information and/or record of the designer's design option selections) for determining whether the designer's selection and corresponding justification are valid.

As described above, a visualization displayed in visualization interface 150 can depend upon previously selected design options. Accordingly, in some embodiments, the computing device displaying the validation interface can generate the visualizations corresponding to the "EmpStatus" design option using a modified dataset. To generate the modified dataset, the computing device can obtain a record of the designer's design option selections (e.g., a record of designer interactions) and the input dataset. The computing device can then generate the modified dataset by applying the design options selected by the designer to the input dataset, thus recreating the input dataset as it existed when the designer decided whether to select "EmpStatus" for exclusion from the design. The computing device can generate the visualizations corresponding to the "EmpStatus" design option using this modified dataset. Additionally or alternatively, in various embodiments, the computing device displaying the validation interface can generate the visualizations corresponding to the "EmpStatus" design option using an intermediate dataset. As described herein, in some embodiments, intermediate datasets can be generated corresponding to designer modifications of design options. The computing device displaying the validation interface can obtain such intermediate datasets. In some embodiments, the intermediate dataset corresponding to the option to exclude "EmpStatus" from the design can be the input dataset as modified by the design options selected preceding the designer's selection of "EmpStatus" for exclusion. The computing device can generate the visualizations corresponding to the "EmpStatus" design option using this intermediate dataset.

In some embodiments, visualization interface 150 can include controls for selecting or interacting with visualizations. For example, a designer can select a particular descriptive statistic for display, or a particular performance measure, or view of the data. In some embodiments, a designer can drill down to display (or edit) particular observations in the modified dataset.

In some embodiments in which visualization interface 150 supports designer interaction, the computing device displaying design user interface 100 can be configured to store, or provide for storage to another computing device, an indication of the designer's interactions with visualization interface 150. These interactions can then be replayed to a reviewer during validation of the designer's design option selections. As a non-limiting example, a designer may determine whether to select "TmAtAddress" (e.g., time-at-address) for exclusion from the design. As part of that determination, the designer may interact with visualization interface 150 to cause visualization interface 150 to display the mean value of "TmAtAddress", stratified by the value of "ResStatus" (e.g., residential status). The designer may then decide to select "TmAtAddress" for exclusion from the design. Consistent with disclosed embodiments, the computing device displaying design user interface 100 can store these interactions (e.g., in a record of designer interactions). In this non-limiting example, a reviewer can interact with a validation interface to validate the decision to select "TmAtAddress" for exclusion from the design. The computing device displaying the validation interface can obtain the record of the designer interactions with visualization interface 150. The computing device can cause the interface to display the same visualization interface. The reviewer can replay the designer's interactions with visualization interface 150 and observe the resulting visualizations. For example, the validation interface can display a replay of the cursor movement or control selections of the designer. As an additional example, the validation interface can enable the reviewer to "step" through the actions of the designer (e.g., use a mouse click, keypress, or the like to move forward or backward through the designer's selections of controls, entry of values, or other suitable interactions with the elements of design user interface 100). In this manner, the reviewer can have the proper context for determining whether the designer's selection and corresponding justification are valid.

In some embodiments, design user interface 100 can include an output interface 160. Output interface 160 can include controls selectable to specify that the computing device providing design user interface 100 generate certain outputs. The disclosed embodiments are not limited to any particular outputs. In some embodiments, the outputs can include the outputs depicted in FIGS. 1B to 1D.

Design user interface 100 and the validation interface have been depicted or described with regards to particular controls. For example, input interface 110 has been described as including a drop-down menu control for selecting an input dataset, selection interface 130 has been described as a list box, design option selection control 141 and design option acceptance control 145 as checkboxes, and justification control 143 as a text entry field. However, the description with respect to FIG. 1A is not intended to be limiting. The disclosed embodiments are not limited to any particular type of control. In various embodiments, buttons, slides, switches, numeric or alphanumeric text boxes, list boxes, spinners, drop-down lists, menus, toolbars, icons, tree or grid view, dialog boxes, palette window, or other suitable controls may be used. For example, input interface 110 can include a directory tree control. As an additional example, selection interface 130 could include a tree or drop-down menu control for selecting a design option. As a further example, design option selection control 141 can be radio buttons or a drop-down menu for selecting design options. As a further example, justification control 143 could include a drop-down menu or radio buttons for selecting a predetermined justification (e.g., a justification specified by the set of rules, technical computing environment or application, or the like).

FIGS. 1B to 1D depict exemplary outputs generated as a result of designer interactions with the exemplary user interface of FIG. 1A, consistent with disclosed embodiments. Such outputs can be generated by the computing device providing design user interface 100. In some embodiments, design user interface 100 can include one or more controls specifying whether the outputs depicted in FIGS. 1B to 1D are generated (e.g., the controls depicted in output interface 160). In various embodiments, one or more of these outputs can be automatically generated.

FIG. 1B depicts an exemplary intermediate dataset, in accordance with disclosed embodiments. The intermediate dataset can be associated with a design option. In some embodiments, the intermediate dataset can reflect the input dataset as changed by the modification of prior design options, as described herein. For example, when a designer modifies one hundred design options, the intermediate dataset corresponding to the one hundred and first design option can reflect these prior modifications. Some design option selections may not modify the input dataset (e.g., model type, model architecture, model segmentation, or like design options). Accordingly, the intermediate dataset generated upon selection of such an option may be the same as the intermediate dataset corresponding to that option (e.g., the intermediate dataset corresponding to the previously selected option). In some embodiments, an order in which the design options are presented to the designer and an order in which the modifications are made can differ. For example, the design user interface can allow the designer to access the design options in any order or return to previously modified design options and revert the modifications to them. When a designer reverts a modification of a first design option, the computing device can be configured to update intermediate datasets corresponding to other second design options. These other second design options can be those modified subsequent to the original modification of the first design option. Updating such intermediate datasets can include replacing them with new intermediate datasets that reflect the reverted modification. For example, if the designer selects design option A, then de-selects design option B, then selects design option C, then re-selects design option B, the intermediate datasets corresponding to design options B and C (but not A) can be updated to reflect the re-selection of design option B. In some embodiments, new intermediate datasets can be generated. For example, intermediate datasets corresponding to the selection of A, deselection of B, selection of C, and reselection of B can be generated. In some embodiments, the computing device providing design user interface 100 can create the intermediate datasets and store them. In various embodiments, the computing device providing design user interface 100 can provide indications of the user modifications to another computing device, which can create the intermediate datasets.

FIG. 1C depicts an exemplary display of a progress summary dataset, in accordance with disclosed embodiments. The progress summary dataset can be configured to store a total number of design options to address, a breakdown of the design options selected or not selected (labeled "excluded" or included, respectively, in the non-limiting example depicted in FIG. 1A), a number of design options for which a justification was provided, and a number of design options that have been reviewed by a reviewer. The progress summary dataset depicted in FIG. 1C is not intended to be limiting.

FIG. 1D depicts an exemplary display of a portion of an exemplary dataset storing the status of design options (in this example, the design option being whether to include or exclude an input variable from a model). Such a dataset can be provided to another computer, together with the input dataset. The other computer can be configured to provide a validation interface and can provide the designer's selections together with the appropriate visualization (based on the input dataset and the designer's selections). In this non-limiting example, a tabular dataset includes a column storing to the names of variables in the input dataset (e.g., customer id or "CustID" and customer age or "CustAge"), a column storing that those variables were excluded, and a column storing a justification for exclusion (e.g., "comment"). In this non-limiting example, the tabular dataset also stores that the exclusion has been accepted by the reviewer (e.g., "validated"). This depiction is not intended to be limiting. In some embodiments, such a dataset can store rows for all of the design options, not only the options selected. In various embodiments, a separate dataset can store whether a design option selection (or de-selection) has been accepted.

Second Exemplary Design User Interface

Figure 7A:
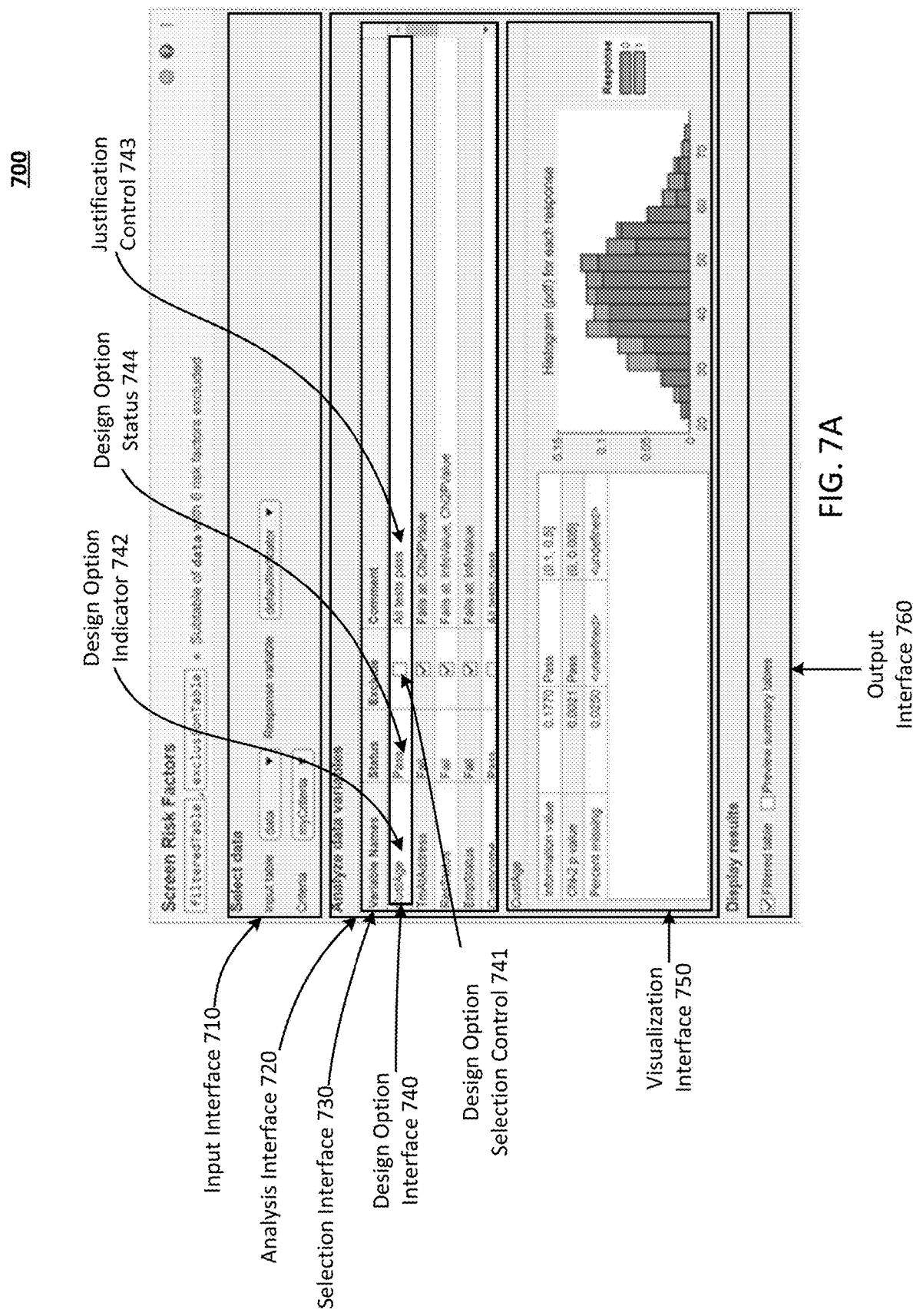
FIG. 7A depicts an additional exemplary user interface for modifying design options, consistent with disclosed embodiments.

FIG. 7A depicts an exemplary design user interface 700, consistent with disclosed embodiments. Design user interface 700 can be displayed to and interacted with by a designer, similar to design user interface 100. In this example, a designer interacts with design user interface 700 to remove inputs variables from an input table based on the predictive power of the input variables. For each input variable, a set of metrics is determined. The input variables are automatically classified based on these metrics. Input variables in a first classification are automatically included, while input variables in a second classification are automatically excluded. The designer is prompted to review input variables in a third classification for inclusion or exclusion.

First, the table of input variables is loaded into a technical computing environment:

load ScreenRiskFactorsData.mat

In this example, the load command causes the table "data" to become available in the workspace of the technical computing environment.

Second, predetermined screening criteria can be loaded into the technical computing environment:

import mrm.data.selection.* myCriteria=ExampleScreeningCriteria( );

In this example, "myCriteria" is a screening criteria object that specifies a set of rules for implementing a standard. These rules are created such that application of these rules to the data results in an interpretation or recommendation regarding the data that is consistent with the standard. In this case, the rules specify that the technical computing environment determine an information value and a Chi-squared p-value for each input variable. These metrics are compared against predetermined thresholds to assign the metric a category of Pass, Fail or Undecided. Each input variable is assigned a category of Pass, Fail or Undecided based on the worst categorization of either metric. For example, if either the information value or the Chi-squared p-value is categorized as Fail (or Undecided), then the overall variable will be assigned the value Fail (or Undecided). In addition, percentage of missing entries in the input variable is displayed (but this value does not affect the automatic classification of the input variable).

The designer can then interact with the technical computing environment to open design user interface 700. Design user interface 700 can include an input interface 710. Input interface 710 can be similar to input interface 110, discussed above with regards to FIG. 1A. In this example, input interface 710 can include three drop-down menus. A designer can interact with a first drop-down menu (labeled "input table") to select a table in the workspace for screening (e.g., "data"). A designer can interact with a second drop-down menu (labeled "Response Variable") to select a response variable (e.g., "defaultindicator"). The predictive power of the input variables will be assessed with respect to this response variable. A designer can interact with a third drop-down menu (labeled "Criteria") to select a screening criteria object that specifies the screening criteria (e.g., metrics) to apply to the input variables (e.g., "myCriteria").

The technical computing environment can then apply the criteria specified by the screening criteria object "myCriteria" to the input variables in the table "data" according to the response variable "defaultindicator". Design user interface 700 can include an analysis interface 720, which can be similar to analysis interface 120, discussed above with regards to FIG. 1A. In this example, analysis interface 720 can display a selection interface 730 (similar to selection interface 130) which can include a scrolling list of design option interfaces. This list can include design option interface 740 (similar to design option interface 140). The scrolling list of design option interfaces can include a design option interface for each input variable in the selected table. Each design option interface includes a design option indicator 742 (similar to design option indicator 142), which can indicate a particular input variable. Each design option interface further includes a design option status 743, which shows the result of the automatic application of the criteria to the input variable (e.g., Pass/Fail/Undecided). In this example, design option status 743 is conveyed using text, but the disclosed embodiments are not so limited. Other possibilities include colors, shadings, animations, or other graphical effects. Each design option further includes a design option selection control 741 (similar to design option selection control 141). In this example, the input variable is excluded from an output dataset when design option selection control 741 is selected. Input variables that fail a criterion specified by myCriteria can be preselected for exclusion in Design user interface 700. A justification control 743 (similar to justification control 143) can be pre-populated with explanations for why input variables are excluded. For example, the input variable "TmAtAddress" can fail the Chi-squared p-value test, while the input variable "EmpStatus" can fail the information value test. In this example, input variables that "Fail" are automatically excluded and input variables that "Pass" are automatically included with automatically generated comments, whereas "Undecided" input variables are left blank for the designer to analyze. These auto-completed values can be overridden by the designer. Note also that all the columns are sortable (e.g., to ease locating the input variable classified as "Undecided").

As shown in FIG. 7A, design user interface 700 can include a visualization interface 750 (similar to visualization interface 150) that displays information about a currently selected design option (in this instance "CustAge"). In this example, visualization interface 750 can display the calculated values for the information value and Chi-square p-value metrics, and the ranges that constitute a passing value (e.g., the interval (0.1, 0.5] for information value and the interval (0, 0.005] for chi-squared p-value). Visualization interface 750 can also display the percentage of missing values (information which may be of value to a designer). Visualization interface 750 can also display a histogram showing the distribution of "CustAge" values for each value of the response variable (e.g., "0" or "1"). In this manner, the double histogram can demonstrate how well (or not) the selected input variable discriminates between the two possible values of the response variable.

The technical computing environment can be configured to generate two outputs. The first output, "filteredTable", can be automatically generated by the technical computing environment when the control "Filtered Table" is selected in output interface 760 (which can be similar to output interface 160). This table is sub-table of the input table, excluding the input variables marked for exclusion. This sub-table can be used in the next step of the model development process. The second output, "exclusionTable", can include all the data of the input table together with the exclusion flags and comments recorded by the technical computing environment. In this exemplary implementation, the exclusion flags and comments are stored in exclusionTable.Properties.CustomProperties metadata. In this non-limiting example, this output is automatically created, and a designer can choose to view summary tables displaying some of this information by selecting the "Preview summary tables" control in output interface 760. The technical computing environment can then display these summary tables. The filteredTable and exclusionTable outputs can be automatically updated by the technical computing environment when the designer selects or deselects an input variable for exclusion.

FIG. 7B depicts an example of a summary table generated when the "Preview summary tables" control is selected. This summary table includes a row for each input variable in the data table input. The columns indicate whether the input variable is excluded from the output table, the name of the input variable, and a comment indicating why the input variable was included or excluded. In some embodiments, the technical computing environment can be configurable to export this table to another file or document FIG. 7C depicts another example of a summary table generated when the "Preview summary tables" control is selected. This table includes a row showing the total number of input variables, the number of input variables excluded, the number of input variables included, and the number of input variables commented upon. In some embodiments, the technical computing environment can be configurable to export this table to another file or document FIG. 7D depicts the filteredTable output generated by excluding the input variables that do not meet the criteria specified by myCriteria. In some embodiments, the technical computing environment can be configurable to export this table to another file or document. In some embodiments, when the "Filtered Table" control is selected in output interface 760, the technical computing environment will automatically display the contents of filteredTable.

In some embodiments, the technical computing system can generate code for filtering the input data based on the designer's interactions with design user interface 700. In some instances, the code can be reused without requiring the designer to repeat the process of reviewing and selecting input variables for exclusion. In some embodiments, the designer can interact with the technical computing environment to replace design user interface 700 with the generated code.

The designer may then edit the generated code directly, providing the designer with more granular control over the design process. The code implementing the filtering can be as follows:

```
import mrm.data.filter.*
% Reset the filtering properties
exclusionTable=resetFilter(data);
% Process exclusions
exclusionTable=setFilterDatum(exclusionTable, "CustAge", false, "All tests pass");
exclusionTable=setFilterDatum(exclusionTable, "TmAtAddress", true, "Fails at: Chi2PValue");
exclusionTable=setFilterDatum(exclusionTable, "ResStatus", true, "Fails at: InfoValue, Chi2PValue");
exclusionTable=setFilterDatum(exclusionTable, "EmpStatus", true, "Fails at: InfoValue");
exclusionTable=setFilterDatum(exclusionTable, "CustIncome", false, "All tests pass");
exclusionTable=setFilterDatum(exclusionTable, "OtherCC", true, "Fails at: InfoValue");
exclusionTable=setFilterDatum(exclusionTable, "AMBalance", true, "Fails at: Chi2PValue");
exclusionTable=setFilterDatum(exclusionTable, "UtilRate", true, "Fails at: Chi2PValue");
exclusionTable=setFilterDatum(exclusionTable, "defaultIndicator", false, "Response variable");
% Process outputs
filteredTable=filterExclusionTable(exclusionTable)
```

In this manner, the exclusion table can be generated and used to create the filtered table. The exclusion table will include metadata describing which input variables in the table "data" are excluded and which are included, and will associate justifications with these inclusion and exclusion decisions. FIG. 7B displays a summary table depicting such metadata.

Consistent with disclosed embodiments, custom screening criteria objects can be created and used in conjunction with design user interface 700. In some embodiments, such objects can be created by editing a class definition:

edit mrm.data.selection.ScreeningCriteria

Where this class is essentially a holder for a handle to a function f with the property that the call f(inputData, 'PredictorVar', varName, 'ResponseVar', respVar) makes sense and produces an mrm.data.validation.MetricsHandler object for any table or timetable inputData, for any predictor variable varName in that table and for a given binary response variable respVar. For example, the definition for ExampleScreeningCriteria, which was used to create the myCriteria object, returns a ScreeningCriteria object defined by an mrm.data.selection.TestSuiteFactory. TestSuiteFactory conforms to the signature described above for the hypothetical function f (e.g., it takes as its inputs a table, a predictor variable name and a response variable name). TestSuiteFactory generates a MetricsHandler that generates two metrics with thresholds (InfoValue and Chi2p) and one information-only metric (percent missing). In this example, the thresholds for classifying input values as "Failed," "Passed," or "Undecided" are hard coded, but these thresholds can be obtained from an appropriate source (e.g., a file, requirements document, or other source in the technical computing environment). TestSuiteFactory sets the StatusInterpreter of the metrics handler to overallScreeningStatus. This is where the auto-generated exclusions and comments are set. For the exclusions, the function assigns to each MetricsHandler state an mrm.data.selection.ScreeningStatus object (or an ErrorTestStatus or NullStatus in edge cases) to ensure that the technical computing environment automatically marks the input variable for exclusion (or not).

Third Exemplary Design User Interface

FIG. 8 depicts an exemplary design user interface 800, consistent with disclosed embodiments. Design user interface 800 can be displayed to and interacted with by a designer, similar to design user interface 100 and design user interface 700. In this example, a designer interacts with design user interface 800 to remove inputs variables from an input table based on the predictive power of the input variables. For each input variable, a set of metrics is determined. The input variables are automatically classified based on these metrics. Input variables in a first classification are automatically included, while input variables in a second classification are automatically excluded. The designer is prompted to review input variables in a third classification for inclusion or exclusion.

In this example, unlike the design user interface 100 or design user interface 700, visualization interface 850 is tabbed. The tabs include a summary statistics tab, a histogram tab (which can display a histogram of values of the selected input variable for each value of the response variable), a screening data tab (which can display the metrics, and classifications thereof, specified by the selected ScreeningCriteria object for the selected input variable), a screening visuals tab that displays visualizations of the selected input variable (e.g., scatter plots of values of the input variable versus other input variables or the response variable), and an overall progress tab (which can display information similar to the information displayed in FIG. 7C). As may be appreciated, design user interface 800 displays the classifications for the metrics in the screening data tab, as opposed to automatically assigning an overall classification (e.g., Fail/Pass/Undecided) to the input variable (as in design user interface 700). In some embodiments, the contents of visualization interface 850 can depend on the selected ScreeningCriteria object. For example, the ScreeningCriteria object can specify the number of tabs, the arrangement of tabs, the labels of the tabs, and what is displayed in the tabs.

Overview Interface

FIG. 2 depicts an exemplary overview interface 200 for validating design option selections, consistent with disclosed embodiments. Consistent with disclosed embodiments, overview interface 200 can be displayed to a reviewer. Overview interface 200 can be displayed by the same computing device as displayed the design user interface (e.g., design user interface 100, design user interface 700, design user interface 800, or the like), or another computing device. Consistent with disclosed embodiments, overview interface 200 can display design options (e.g., in the "Design Option" column). In the non-limiting example depicted in FIG. 2, a designer may be constructing a model for categorizing patients into a group of patients suitable for a heart disease treatment and a group of patients unsuitable for a heart disease treatment. In the non-limiting, hypothetical example depicted in FIG. 2, an input dataset can include PlanID variables identifying a healthcare plan of a patient, a postcode or zip code variable including a postcode or zip code of the patient, a patient age, patient sex, patient weight, patient blood pressure categorization (HPB), patient smoker status, patient family history of heart disease, and the presence or absence of a genetic variant speculatively linked to heart disease outcomes.

Consistent with disclosed embodiments, selection of design options may be governed by rules that implement a standard. In this hypothetical example, the standard may specify that treatments must be offered based on the likely medical effectiveness of the treatment, given present medical knowledge, and without discriminating on the basis of ability to pay or protected patient characteristics. This standard may generally govern the development of designs for categorizing patients for medical treatment. Rules may have been developed to implement this standard with respect to this exemplary application and using this particular input dataset.

Overview interface 200 can also display a "Standard Code" variable. The standard code can represent a risk category (e.g., "1" is "low risk", "2" is "medium risk", and "3" is "high-risk") for selecting the corresponding design option. For example, selecting a data input design option to exclude "PlanID" from input into the model may be categorized as "low risk", because the designer of the rules may believe (in accordance with the standard) that the healthcare plan of a patient has no legitimate bearing on the design of the model. In contrast, selecting a data input design option to exclude "HPB" (a categorical variable indicating that the patient has high blood pressure) from the dataset may be categorized as a "high risk" because the designer of the rules may believe that the blood pressure category of a patient includes medically relevant information, and therefore excluding this information from the model risks violating the principle advanced in the standard that treatments must be offered based on medical effectiveness.

In some embodiments, modification of one design option can affect the categorization of another design option. For example, the set of rules may specify that the "FamilyHist" (e.g., a categorical variable indicating a family history of heart disease) and "GenVariant" (e.g., a categorical variable indicating the presence or absence of a genetic variant speculatively linked to heart disease outcomes) are alternatives. In this example, the set of rules can specify that when one of these input variables is included, the other need not be included. For example, when "FamilyHist" is included, "GenVariant" can be categorized as "low risk". When "FamilyHist" is excluded, "GenVariant" can be categorized as "high risk". Similarly, inclusion of certain input variables may cause the certain model architectures to be categorized as "high-risk". For example, sensitive input variables like patient race or patient address may be categorized as high risk when using models that are more difficult to analyze, such as neural network models. Thus selection of such a model architecture can cause the inclusion of such input variables to be deemed "high-risk", potentially invalidating the prior selection (or subsequent selection) of such variables for inclusion in the design (or requiring that such selection be justified and accepted by a reviewer).

Overview interface 200 can also display a "Justification" variable. The justification variable can store a justification provided by the designer for selecting a design option. Consistent with disclosed embodiments, in this non-limiting example, the justification can be selected by the designer from a set predetermined by the rules. In this example, the rules may specify that the designer must enter a justification for a design option selection when the risk category is greater than "1" and may enter a justification when the risk category is "1".

Overview interface 200 can also display a "Design" variable. The design variable can store the designer's selection of a corresponding design option. Consistent with disclosed embodiments, in this non-limiting example, the value of design corresponding to "Use 3-layer Network" can be "N" (e.g., "No") as the designer chose not to select that model architecture design option.

Overview interface 200 can also display a "Review" variable. The review variable can store the reviewer's acceptance or rejection of the designer's selection of a corresponding design option. Consistent with disclosed embodiments, in this non-limiting example, the reviewer has rejected the designer's selection of a neural network model (e.g., the "R" stored in the review variable corresponding to the "Use Neural Network" design option indicates rejection) and accepted the designer's selections of the data input option to exclude patent plan ID from the input to the design (e.g., the "A" stored in the review variable corresponding to the "Exclude PlanID" design option indicates acceptance).

Overview interface 200 can also display a "Comment" variable. The comment variable can store comments provided by the reviewer concerning the reviewer's acceptance or rejection of the designer's selection of the design option. Consistent with disclosed embodiments, in this non-limiting example, the reviewer has provided the justification "Likely Overfitting" in rejecting the designer's selection of a 10-layer neural network architecture. In some embodiments, the reviewer can select a comment specified by the rules. In various embodiments, the reviewer can provide comments. In some embodiments, the validation interface may require a reviewer to provide a comment for every rejected selection. In various embodiments, the validation interface may only require the reviewer to provide a comment when a risk category of the selection satisfies a criterion (e.g., only when the risk category is "2" or greater, or the like).

Consistent with disclosed embodiments, overview interface 200 can be configured to enable a reviewer to filter design options based on a value of the "Standard Code." For example, the reviewer can interact with overview interface 200 to cause overview interface 200 to display only design options having a risk category in the "Standard Code" column greater than "1" (or greater than "2", or the like). As an additional example, the reviewer can similarly cause overview interface 200 to display only design options having a risk category in the "Standard Code" column equal to "1" (or to "2" or to "3", or the like). The disclosed embodiments are not limited to filtering based on the standard code. Consistent with disclosed embodiments, overview interface 200 can be configured to enable a reviewer to filter design options by other values of other variables displayed in overview interface 200.

Consistent with disclosed embodiments, overview interface 200 can be configured to enable a reviewer to select a particular design option (or set of design options) for validation. The disclosed embodiments are not limited to a particular set of controls for selecting one or more design options for validation. In some embodiments, entries in overview interface 200 can be selectable. For example, selecting the model segmentation design option "Segment on Sex" can cause the computing device providing overview interface 200 to display a validation interface. In some embodiments, the validation interface can be similar to (or the same as) the design user interface 100, thereby providing the reviewer the appropriate context for evaluating the designer's decision. In some instances, for example, the validation interface can be configured to display the design option, the designer's selection of the design option, and similar or the same contextual information as displayed by the design user interface 100.

Design Option Modification and Review Process

Figure 3:
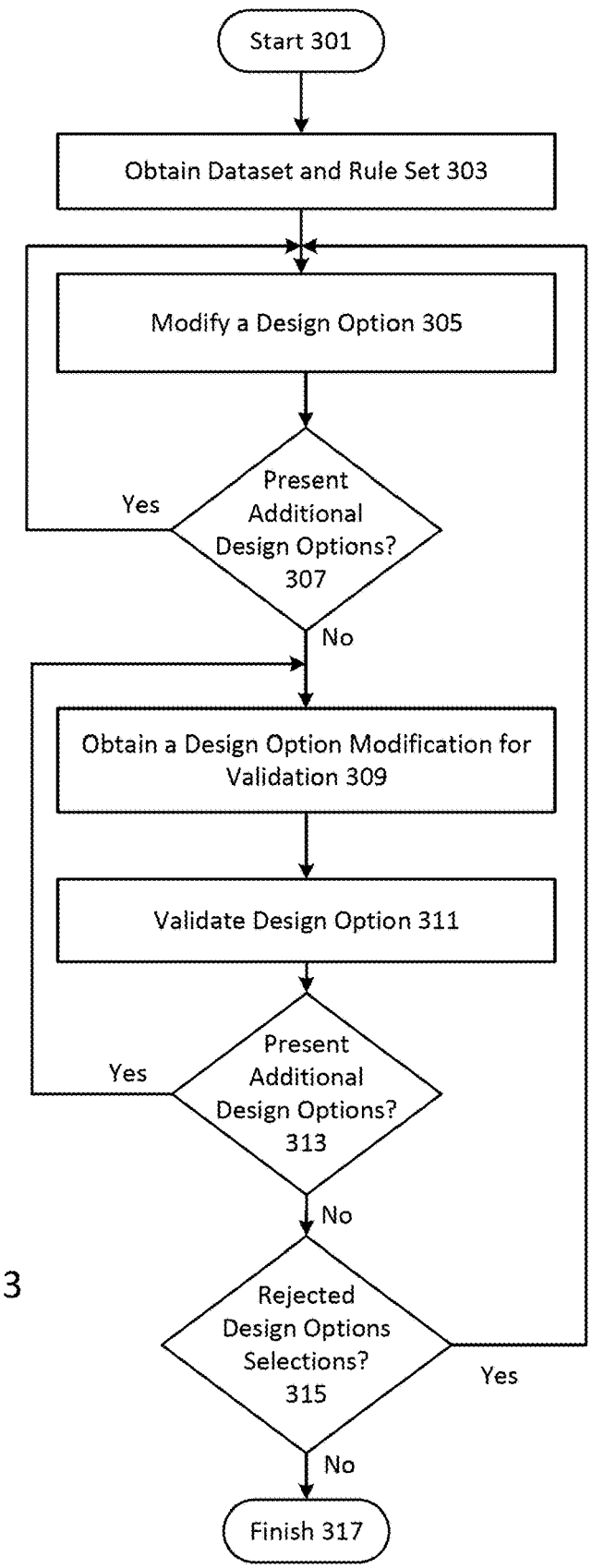
FIG. 3 depicts an exemplary method for modifying and validating design options, consistent with disclosed embodiments.

FIG. 3 depicts an exemplary method 300 for selecting and validating design options, consistent with disclosed embodiments. Method 300 can be performed by a computing device using a design user interface (e.g., design user interface 100, design user interface 700, design user interface 800, or the like) and a validation interface. The validation interface may resemble the design user interface but may include additional elements. These elements (e.g., columns or the like) may enable the reviewer to accept or reject design option modifications proposed by the designer and propose comments or justifications for such acceptance or rejection. Similarly, the validation interface may exclude elements of the design user interface that are not helpful to the reviewer, to avoid cluttering the validation interface. In accordance with method 300, a designer can select options for a design. A reviewer can validate these selections, reviewing them in a context similar to the context in which the designer made the selections. In this manner, a design can be developed while ensuring design decisions are traceable and reviewed for consistency with a standard, thereby improving the development and validation of such designs.

At step 301, method 300 can begin. Method 300 can be a phase in a multi-step design process, as described herein with respect to FIG. 4. For convenience of explanation, method 300 is described as being performed using a single computing device. However, method 300 can be performed using one or more computing devices. In some embodiments, one or more user computing devices can perform steps 303 to 307, while one or more validation computing devices can perform steps 309 to 315. Method 300 can include an initial phase (not depicted in FIG. 3) of developing rules that implement a standard governing the design. In some embodiments, one or more rules computing devices can be used to develop the rules that implement the standard. In some embodiments, such rules can be implemented using a screening criteria object, as described above with regards to FIGS. 7A to 7D and design user interface 700.

At step 303, the computing device can obtain an input dataset (e.g., the data table described with regards to FIG. 7A) and a rule set (e.g., the myCriteria screening criteria object described with regards to FIG. 7A). The computing device can retrieve at least one of the input dataset or the rule set from a non-transitory computer-readable medium accessible to the computing device (e.g., a cache; memory; magnetic, optical, or solid-state storage; network-accessible storage device; or another suitable computer-readable medium). The computing device can receive at least one of the input dataset or the rule set from another computing device (e.g., over a network) or from a designer (e.g., through interactions with a user interface). The computing device can create at least one of the input dataset or the rule set (e.g., as the output of a program or application executing on the computing device, through data entered into or acquired by the computing device, or the like). In various embodiments, the computing device can obtain the input dataset and the rule from the same location (e.g., the computer-readable medium, other computing device, or the like), or from differing locations. In various embodiments, the computing device can obtain all of the input dataset from one location or can obtain differing portions of the input dataset from differing locations. In various embodiments, the computing device can obtain all of the rules in the rule set from the same location or can obtain differing subsets of the rule set from differing locations.

At step 305, a designer can modify a design option. In various embodiments, the designer can interact with a user interface (e.g., design user interface 100, or the like) to modify the design option. The user interface can provide contextual information to support the selection of the design option. The contextual information can be included in one or more visualizations corresponding to the design option. The computing device can be configured to store (or provide for storage by another computing device) the modification in a record of designer interactions. In various embodiments, the computing device can be configured to store (or provide for storage by another computing device) the input dataset in the record of designer interactions. In various embodiments, the computing device can be configured to generate an intermediate dataset in response to the designer selection of the design option. The computing device can store (or provide for storage by another computing device) the intermediate dataset in the record of designer interactions. In some embodiments, in addition to storing designer selections and the like, the record of designer interactions can store metadata about the selection process. Such metadata can include one or more of an identifier of the designer, a session identifier, an IP address associated with the designer (e.g., when the designer is interacting remotely with the computing device providing the design user interface through a web browser, telnet session, or the like), a time of the session or of an individual selection of a design option, or other suitable data for identifying when and who made the selection.

At step 307, at least one of the computing device or the designer can determine whether to present additional design options for selection. In some instances, the computing device can repeatedly present a subset of the design options (e.g., a single design option; a complementary set of design options, such as selections of different model types, different model architectures, or different segmentation options, or the like; or other suitable subsets of design options) until the designer has considered all design options. In various instances, a designer selection of a design option may render other design options irrelevant (e.g., selection of a regression model may render irrelevant a design option to select a number of layers for a neural network model). In some embodiments, the computing device can be configured to determine whether a design option has been rendered irrelevant by another design option. In such embodiments, the computing device may not provide irrelevant design options to the designer or may provide them together with an indication that they are irrelevant (e.g., greyed out, unselectable, hidden, or the like). The computing device can be configured to track the remaining relevant design options and determine when all relevant design options have been presented.

In some embodiments (e.g., as depicted in FIG. 1A, FIG. 7A, FIG. 8, or the like) the computing device can provide a designer a selection of design options and the designer can select among various design options. In response to a selection of a design option, the user interface can provide relevant contextual information. In such embodiments, the computing device may determine whether presented design options have been rendered irrelevant by other selected design options and may update the user interface to indicate such irrelevance (e.g., by removing the irrelevant design options from the interface, or by providing them together with an indication that they are irrelevant, as described herein). In such embodiments, when the designer determines that they have selected all desired design options, they can provide an indication that the selection process is complete (e.g., interacting with a control to indicate that all desired selections have been performed, or the like).

Consistent with disclosed embodiments, method 300 can return to step 305 to present any remaining design options. When all design options have been presented and the designer has entered all required modifications and justifications, method 300 can proceed to step 307. Consistent with disclosed embodiments, prior to proceeding to step 307, the computing device can be configured to ensure that all justifications required by the rules have been provided, and that any selections required by the rules have been made.

In step 309, the design option modifications can be obtained. In some embodiments, at least one of the input dataset or intermediate datasets can be obtained. In some embodiments, the computing device can obtain a record of designer interactions including the design option modifications. The record of designer interactions may include at least one of the input dataset or intermediate datasets. In various embodiments, at least one of the input dataset or intermediate datasets can be obtained separately from the record of designer interactions. For example, the input dataset, intermediate datasets, and record of designer interactions can each be stored separately and obtained separately. Obtaining the record of designer interactions, input dataset, or intermediate datasets can include retrieving one or more of them from a non-transitory computer-readable medium accessible to the computing device (e.g., a cache; memory; magnetic, optical, or solid state storage; network-accessible storage device; or other suitable computer-readable medium); or receiving one or more of them from another computing device (e.g., over a network) or from a designer (e.g., through interactions with a user interface).

In step 311, the reviewer can interact with a validation interface to accept or reject a modification to the selected design option. As described herein, the validation interface can be similar to, or the same as the user interface (e.g., design user interface 100, design user interface 700, design user interface 800, or the like). For each design option, the validation interface can display similar or identical contextual information as the user interface. For example, the validation interface can display the contextual information displayed in the design user interface in a different arrangement or format, can display only a subset of the contextual information displayed in the design user interface, or can display additional contextual information. When the user interface displays the contextual information in one or more visualizations, the validation interface can display the similar or identical contextual information in one or more similar or identical visualizations. For example, when the visualization is a graph, at least one of the type of graph, graph axis, labeling, or other graphical elements can be the same as in the design user interface. The validation interface can provide the reviewer a control for accepting or rejecting the designer's modification to the design options. In some embodiments, the validation interface can provide a control for providing comments. Consistent with disclosed embodiments, the set of rules can specify that all or some of the designer's modifications be reviewed. Consistent with disclosed embodiments, the set of rules can specify that all or some of the rejected modifications be accompanied by comments. The validation interface can be configured to require the reviewer to accept or reject a modification (or enter a comment) before allowing the reviewer to proceed to another design option modification, exit an interactive session, of complete review of a set of design options.

Consistent with disclosed embodiments, the validation interface can enable the reviewer to perform "what-if" analysis. In such an analysis, the reviewer can select an alternative modification to a design option and observe how the alternative modification affects the input dataset or the design. In some embodiments, the reviewer can select the alternative modification in the same manner that the designer selected the original modification. For example, when the designer selects the original modification by selecting a checkbox (e.g., as displayed in FIG. 1A, FIG. 7A, FIG. 8, or the like) the reviewer can select an alternative modification by deselecting the checkbox. Similarly, when the designer selects the original modification by selecting one of a set of radio buttons, the reviewer can select the alternative modification by selecting another of the radio buttons.

In some embodiments, changing the modification can cause other design option modifications selected by the designer to become irrelevant (e.g., when the reviewer changes a selection of a model type or architecture). In such embodiments, the computing device can be configured to enable the reviewer to step through newly relevant design options and skip the newly irrelevant design options (e.g., having switched from a neural network classifier to a clustering model, the review can be presented with a design option concerning the number of clusters and can skip design options concerning the number of layers in the neural network model). In various embodiments, changing the modification can change the input dataset. Accordingly, design options reviewed during such a "what-if" analysis can be presented together with contextual information that reflects the selected alternative modification. For example, a reviewer may deselect a design option to exclude a portion of the input dataset from input into the design. In this example, the reviewer can then review a design option to include a logistic regression in the design. The visualization corresponding to this design option can depict the input dataset as modified by prior design option selections, including the deselection of the decision to exclude a portion of the input dataset from input into the design. To continue this example, the reviewer may deselect the design option to include a logistic regression model in the design and instead select a design option to include a neural network model in the design. The reviewer can then review another design option to select a number of layers in the neural network model. The corresponding visualization can depict the application of the selected neural network model (e.g., having the potentially selected number of layers) to the input dataset as modified by prior design options (including the deselection of the design option to exclude a portion of the input dataset).

Consistent with disclosed embodiments, the computing device can store (or provide for storage) the reviewer's modifications of the designer's design option selections in a record of reviewer interactions. In some embodiments, this record can store the reviewer's acceptance or rejection of the designer's modification of a design option. In some embodiments, this record can store the order in which the reviewer considered the designer's modifications, or the order in which the reviewer accepted or rejected the designer's modifications. In some embodiments, this record can store reviewer's comments regarding the acceptance or rejection of the designer's modifications. In various embodiments, "what-if" analysis and corresponding updated intermediate datasets can also be stored in the record of reviewer interactions.

Consistent with disclosed embodiments, a reviewer's acceptance or rejection of a designer's modification of a design option can be stored in association with the designer's modification of the design option. In some embodiments, for example, the record of reviewer interactions can include the record of designer interactions. Such a combined record can have, in some embodiments, a logical structure similar to the layout of the exemplary overview interface 200 depicted in FIG. 2. For example, a tabular dataset can include a row for each design option and columns storing values indicating, at least in part, whether the designer modified the design option (or whether the design option was selected), any justification provided by the designer for any modification, whether the reviewer accepted the modification, and any comment provided by the reviewer regarding acceptance or rejection of the modification.

In some embodiments, in addition to storing reviewer acceptances and rejections, reviewer comments, what-if analysis, or the like, the record of reviewer interactions can store metadata about the review process. Such metadata can include one or more of an identifier of the reviewer, a session identifier, an IP address associated with the reviewer (e.g., when the reviewer is interacting remotely with the computing device providing the validation interface through a web browser, telnet session, or the like), a time of the session or of an individual acceptance or rejection of a design option selection, or other suitable data for identifying when and who made the acceptance and rejection.

In step 313, at least one of the computing device or the reviewer can determine whether to present additional design options for selection. Similar to step 307, in some instances, the computing device can repeatedly present a subset of the design options modified by the designer until the reviewer has considered all design options modified by the designer.

In some embodiments the computing device can provide a reviewer a selection of design options modified by the designer. The reviewer can select among the modified design options to review. In some embodiments, for example, the computing device can provide an overview interface (e.g., overview interface 200, or the like) listing design options, the designer's selections with respect to the design options, and the designer's justifications with respect to the selections. In some embodiments, the overview interface may also depict the reviewer's acceptance or rejection of the designer's selections and the reviewer's comments with respect to such acceptances or rejections. In response to a selection of a design option, the computing device can provide a validation interface for that design option that provides relevant contextual information for determining whether to accept or reject the designer's selection of that design option. In such embodiments, when the reviewer determines that they have reviewed all desired design option modifications, they can provide an indication that the review process is complete (e.g., interacting with a control to indicate that all desired design option modifications have been reviewed, or the like).

Consistent with disclosed embodiments, method 300 can return to step 309 to present any remaining design option modifications for review. When all design option modifications have been presented and the reviewer has accepted or rejected them (and provided comments as desired or as required by the rules), method 300 can proceed to step 315. Consistent with disclosed embodiments, prior to proceeding to step 315, the computing device can be configured to ensure that all justifications required by the rules have been provided, and that any selections required by the rules have been made.

In step 315, at least one of the computing device or the designer can determine whether the reviewer has rejected a design option modification. In some embodiments, the computing device can obtain acceptances or rejections of design modifications in a similar or the same manner as the computing device obtained the design modifications in step 309. In some embodiments, the computing device can obtain the record of reviewer interactions. The record of reviewer interactions can specify the reviewer's acceptance or rejection of modifications of design options.

Consistent with disclosed embodiments, when the reviewer has rejected a modification to a design option, method 300 can return to step 305. In some instances, the designer may then select an alternative design option. Such a selection can include reverting the modification to the design option. For example, when the design option was pre-selected (e.g., as a result of the application of the set of rules to the design options, or the like) and the designer de-selected the design option, the designer may re-select the option in response to the rejection of this modification. Similarly, when the design option was not originally selected and the designer selected the design option, the designer may deselect the design option in response to the rejection of this modification. In some embodiments, selecting an alternative design option can include modifying another design option. For example, the designer might de-select a neural network model type and select a logistic regression model type. In various instances, the designer may revise the justification. For example, when the designer originally justified excluding a variable as "unnecessary", the reviewer can revise the justification to read "Minor increase in model accuracy outweighed by increase in model storage and compute requirements." In some instances, the designer may revise the justification without revising the modification (e.g., providing addition reasons why the original modification was justified). In various instances, the designer may revise both the modification and the justification (e.g., providing a new justification corresponding to the new modification). In some embodiments, the computing device can be configured to store (or provide for storage) the new designer modifications and justifications in the record of designer interactions. In some embodiments, the new designer modifications and justifications can overwrite the prior, rejected modifications and justifications. In various embodiments, the new designer modifications and justifications can be appended to the record of designer interactions. Just like the original modifications and justifications, the new modifications and justifications can be validated by a reviewer, as described herein.

Consistent with disclosed embodiments, when the reviewer does not reject any of the modifications or justifications, method 300 can proceed to step 317. In step 317, method 300 can terminate. As would be appreciated by those of skill in the art, method 300 can be repeated multiple times in the develop of a design.

Multi-Stage Development Process

Figure 4:
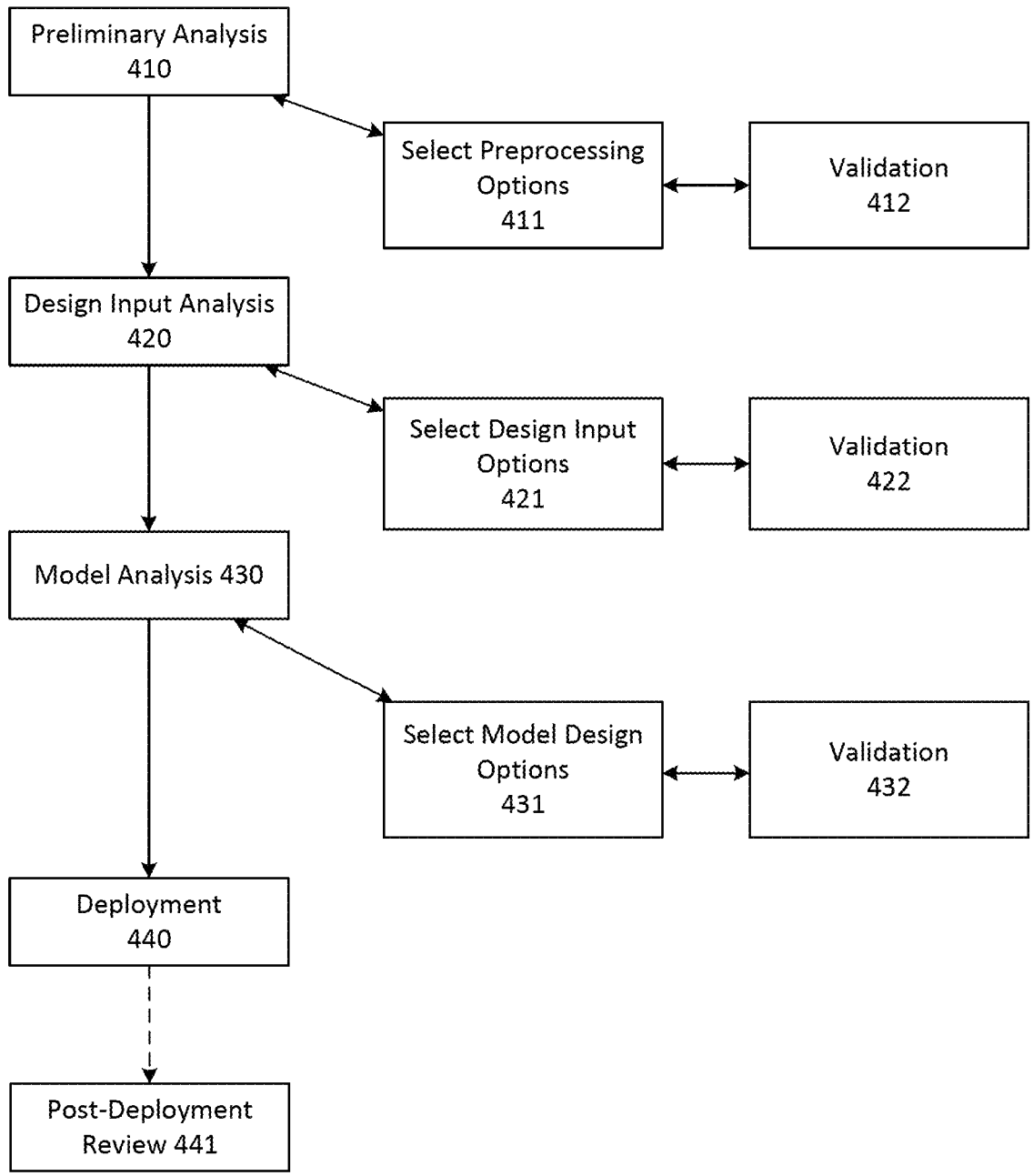
FIG. 4 depicts an exemplary method of design development including multiple iterations of the process of FIG. 3, consistent with disclosed embodiments.

FIG. 4 depicts an exemplary method of design development (e.g., method 400) including multiple iterations of the process of FIG. 3, consistent with disclosed embodiments. FIG. 4 depicts development of a model, for ease of explanation, but the disclosed embodiments are not so limited. In this particular example, the development process includes four stages. However, the envisioned embodiments can include development processes having additional stages or fewer stages. For example, in some instances, the development process may include only two stages: a model design stage (e.g., a combination of stages 410, 420, and 430) and a deployment and post-deployment review stage (e.g., a combination of stages 440 and 450). As an additional example, in some instances, the development process may not include deployment and post-deployment review stages (e.g., the development process may include stages 410, 420, and 430).

Consistent with disclosed embodiments, method 400 can include the automatic, or semiautomatic generation of code for implementing the design. A computing device (e.g., a computing device providing the design user interface, a computing device providing the reviewer interface, or another computing device) can be configured to generate the code or instructions. The generated code can be or include at least one of Ada, Basic, C, C++, C#, FORTRAN, MAT-LAB, machine code, assembly code, GPU code, and HDL code, such as VHDL, Verilog, SystemC, or netlists, among others. The computing device can generate the code using any suitable code generator.

Consistent with disclosed embodiments, the code can be automatically or semiautomatically generated prior to deployment of the design in step 440. In some embodiments, the code implementing a stage of development can be generated upon completion of that stage of development. For example, code for preprocessing the input dataset can be generated once the reviewer has accepted all outstanding designer modifications to preprocessing design options. In various embodiments, code for performing operations involved in preparing the input dataset for use by the design (e.g., preprocessing the input dataset, including or excluding portions of the input dataset, or the like) can be generated once the reviewer has accepted all designer design modifications concerning preparation of the input dataset for use by the design. In such embodiments, the code can be generated prior to modification of model type, model architecture, or model segmentation options. In various embodiments, the code can be generated once a model is ready for deployment.

In steps 410, 411, and 412 of method 400, a designer can determine how to pre-process the input dataset and a reviewer can validate the modifications of these preprocessing design options. Consistent with disclosed embodiments, preprocessing can prepare the input dataset for use in developing a design. However, such preprocessing can also introduce sources of bias into the data or obscure evidence of fraudulent or incorrect inputs. Accordingly, modifications to data preprocessing options can be tracked and validated, consistent with disclosed embodiments.

In step 410, the designer can conduct preliminary analysis on the input dataset. The disclosed embodiments are not limited to any particular type or manner of preliminary analysis. In some embodiments, the designer can examine summary statistics (e.g., number, number missing, mean, max, min, standard deviation, or the like) of the input dataset, view frequency plots of values for portions of the input dataset, examine correlations between portions of the input dataset, or the like.

Consistent with disclosed embodiments and based on the preliminary analysis, in step 411, the designer can modify preprocessing design options for the input dataset. The designer can modify preprocessing design options using a user interface (e.g., design user interface 100, design user interface 700, design user interface 800, or the like). The preprocessing design options can include performing, on a portion of the input dataset, scaling, offsetting or recentering, replacing missing values with imputed values, identifying and replacing outlier values, coding values into categorical variables, or other suitable data preprocessing operations. In some embodiments, the definition of "outlier value" or "missing value" can depend on the dataset, portion of the dataset including the outlier values, the intended purpose of the design, or the like. As a nonlimiting example, in some instances, an outlier value can be more than a certain number of standard deviations away from the mean. As another nonlimiting example, a missing value can be a null-string character, a NaN value, a NaC (not-a-character)

value, or the like. In some embodiments, the selection of preprocessing options and the preliminary analysis can be performed together, with modification of the preprocessing operations informing and affecting the input dataset and thereby influencing other modifications to the input dataset.

Consistent with disclosed embodiments, in step 412 a reviewer can validate the selections performed by the designer in step 411. The reviewer may accept or reject the selections, as described herein with respect to FIG. 3. When the reviewer rejects a modification of a data preprocessing design option, the designer may revise the modification or provide an additional justification. When the designer has performed all intended design option modifications, and the reviewer has accepted all such modification, method 400 can proceed to step 420.

In steps 420, 421, and 422 of method 400, the designer can determine what portions of the input data to include in the design. Consistent with disclosed embodiments, the choice of inputs to the design can determine the design performance. For example, excluding predictive inputs can reduce the performance of the design. But including too many inputs can also degrade the performance of the design and increase the memory and computational requirements for developing and deploying the design. Additionally, as described herein, certain portions of the dataset may include sensitive data. Designs trained on this data may risk violating a standard governing the design. Furthermore, a priori knowledge may support the inclusion or exclusion of certain portions of the input dataset. Accordingly, modifications to data input options can be tracked and validated, consistent with disclosed embodiments.

In step 420, the designer can analyze portions of the input dataset (as modified by the data processing options selected in step 411) for inclusion in the model. In some embodiments, step 420 can also involve creating features for inclusion in the model. The designer may apply statistical methods to identify redundant portions of the input dataset using correlations, or portions of the input dataset that, when included or excluded, improve the performance of some test model(s) (which may or may not be included in the final design).

Consistent with disclosed embodiments and based on the design input analysis, in step 421, the designer can modify data input options for the input dataset. The designer can modify data input options using a user interface (e.g., design user interface 100, design user interface 700, design user interface 800, or the like). The data input options can include selecting a portion of the input dataset or a feature for inclusion in (or exclusion from) the design.

Consistent with disclosed embodiments, in step 422 a reviewer can validate the selections performed by the designer in step 421. The reviewer may accept or reject the selections, as described herein with respect to FIG. 3. When the reviewer rejects a modification of a data input design option, the designer may revise the modification or provide an additional justification. When the designer has performed all intended design option modifications, and the reviewer has accepted all such modification, method 400 can proceed to step 430.

Though steps 410 and 420 are depicted as separate steps, in some embodiments these steps can be combined. For example, step 410 (e.g., the preliminary analysis) and step 420 (e.g., the design input analysis) can be performed in a single step. Likewise, the modification of preprocessing design options and data input design options can be combined into a single step. The validation of these modifications can also be performed as a single step.

In steps 430, 431, and 432 of method 400, the designer can determine characteristics of the design. In some instances, when the design includes a model, the characteristics can include at least one of a model type, model architecture, or model segmentation. Given the numerous potential options for selecting and configuring a model, the designer may select a model that overfits the data. Furthermore, the designer may select a model incompatible with the standard. As described herein, certain complex or non-intuitive model types (e.g., neural network models, or the like) may be disfavored. Alternatively or additionally, a standard may require certain model types (e.g., linear regression models, or the like). Furthermore, some model segmentations may be permissible (e.g., segmenting a model to predict automobile accident risk on the basis of sex) while other model segmentations may be impermissible (e.g., segmenting a credit risk model on the basis of race).

Consistent with disclosed embodiments, in step 430, the designer may perform a model analysis. The designer may experiment with different model types, architectures, and segmentation options. The disclosed embodiments are not limited to any particular type or process of such a model analysis. In step 431, the designer may modify model type options, model architecture options, or model segmentation options based on the analysis performed in step 430. The designer may interact with a design user interface to select such design options (e.g., design user interface 100, design user interface 700, design user interface 800, or the like). In step 432, a reviewer may validate the designer's modifications to model type, model architecture, and model segmentation options. The reviewer may accept or reject the selections, as described herein with respect to FIG. 3. When the reviewer rejects a modification of such a model design option, the designer may revise the modification or provide an additional justification. When the designer has performed all intended design option modifications, and the reviewer has accepted all such modification, method 400 can proceed to step 440.

In step 440 of method 400, the model can be deployed. The disclosed embodiments are not limited to any particular manner of deploying the model. In some embodiments, deploying the model can include automatically generating code implementing the design. Such code could include Ada, Basic, C, C++, C#, FORTRAN, MATLAB, machine code, assembly code, GPU code, and HDL code, such as VHDL, Verilog, SystemC, or netlists, among other suitable computer code. In some embodiments, deploying the model can include executing or interpreting code implementing the design. The deployed model can be used for the purposes for which it was created. For example, a model created to predict credit risk from customer financial data can be provided customer financial data and return credit risk information. As an additional example, a model created to classify patients into those likely to respond to a treatment and those unlikely to respond can be provided patient data and return patient classifications.

In optional step 441 of method 400, a post-deployment review can be performed. The post-deployment review can include repeating the development process using a new input dataset. The new input dataset can include data gathered following deployment of the design. In repeating the development process, a user (which may or may not be the same designer that developed the design), can consider the previously selected preprocessing, data input, and design architecture modifications. The user can interact with a user interface (e.g., design user interface 100, or the like) to repeat the development process. The user can review one or more of the design modifications together with contextual information for the new dataset as modified by the previously chosen design option modifications (e.g., a portion of the modified new dataset, descriptive information for the modified new dataset, an application of the design, as specified by the design option modifications, or the like). In this manner, the user can observe whether the design is being applied to data similar to the data used to develop the design. In some embodiments, the application of the rules to the new data can cause certain design options to require new justification or modifications. In some embodiments, the user may select new modifications, which may be validated by a reviewer, as described herein.

Exemplary Computing Environment

Figure 5:
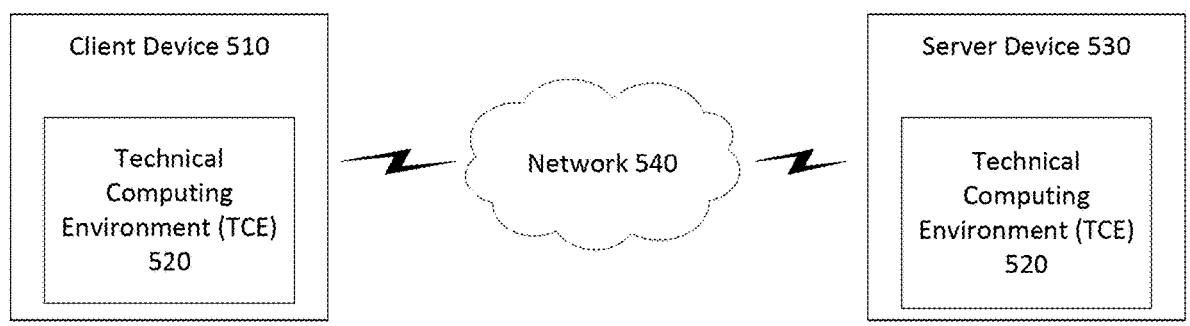
FIG. 5 depicts an exemplary computing environment in which systems and/or methods, described herein, may be implemented, consistent with disclosed embodiments.

FIG. 5 depicts an exemplary computing environment 500 in which systems and/or methods, described herein, may be implemented, consistent with disclosed embodiments. In some instances, such a computing environment can be included in, include, or implement functionalities of a design environment as described herein. As shown in FIG. 5, environment 500 may include a client device 510, which may include a programming environment (e.g., TCE 520). Furthermore, environment 500 may include a server device 530, which may include the programming environment (e.g., TCE 520), and a network 540. Devices of environment 500 may interconnect via wired connections, wireless connections, or a combination of wired and wireless connections.

Consistent with disclosed embodiments, the TCEs supported by client device 510 and server device 530 can perform design option modification and validation. In some embodiments, a TCE provided by one of client device 510 and server device 530 can be configured to provide a user interface for modifying design options (e.g., design user interface 100, design user interface 700, design user interface 800, or the like). In various embodiments, a TCE provided by one of client device 510 or server device 530 can provide a validation interface, as described herein. In various embodiments, a TCE provided by one of client device 510 and server device 530 can provide an overview interface, as described herein. A user can interact with a user interface provided by at least one of client device 510 or server device 530 to perform steps of method 300 or method 400. A reviewer can interface with a user interface provided by at least one of client device 510 or server device 530 to perform steps of method 300 or method 400. In various embodiments, a user can interact with at least one of client device 510 or client device 530 to obtain a set of rules for implementing a standard. In some embodiments, the systems and method described herein can be implemented outside a TCE, e.g., as part of the stand-alone program.

Client device 510 may include one or more devices capable of receiving, generating, storing, processing, and/or providing program code or information associated with program code (e.g., text, a token, an error, a pattern, etc.). For example, client device 510 may include a computing device, such as a desktop computer, a laptop computer, a tablet computer, a mobile phone (e.g., a smart phone, a radiotelephone, etc.), or a similar device.

Client device 510 may host TCE 520. TCE 520 may include any hardware-based component or a combination of hardware and software-based components that provides a computing environment that allows tasks to be performed (e.g., by users) related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In some implementations, TCE 520 may include a programming language that supports dynamic typing (e.g., the M language, a MATLAB® language, a MATLAB-compatible language, a MATLAB-like language, *Julia*, Python, etc.) that can be used to express problems and/or solutions in mathematical notations.

For example, TCE 520 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, TCE 520 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state-based analysis and/or design, etc.

TCE 520 may further provide mathematical functions and/or graphical tools (e.g., for creating plots, surfaces, images, volumetric representations, etc.). For example, TCE 520 can provide graphical tools for viewing or analysis of large datasets, as described herein. In some embodiments, TCE 520 can enable implementation determination of a design parameter based on other design parameters, using the relationships described herein. Thus, consistent with disclosed embodiments, TCE 520 can enable a user to select design parameters (e.g., datatypes, minimum noise values, matrix dimensions, overflow probabilities, or the like) without conducting extensive simulations or defaulting to unnecessarily complex datatypes (e.g., double precision floating-point datatypes, or the like). In some implementations, TCE 520 may provide these functions and/or tools using toolboxes (e.g., toolboxes for signal processing, image processing, data plotting, parallel processing, etc.). In some implementations, TCE 520 may provide these functions as block sets or in another way, such as via a library, etc.

TCE 520 may be implemented as a text-based programming environment (e.g., MATLAB software; Octave; Python; Julia by Julia Computing, Inc., Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.), a graphically-based programming environment (e.g., Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; etc.), or another type of programming environment, such as a hybrid programming environment that includes one or more text-based programming environments and one or more graphically-based programming environments.

TCE 520 may include a programming language (e.g., the MATLAB language) that may be used to express problems and/or solutions in mathematical notations. The programming language may allow a user to enter commands to be executed by TCE 520. The programming language may be dynamically typed and/or array based. In a dynamically typed array-based computing language, data may be contained in arrays and data types of the data may be determined (e.g., assigned) at program execution time.

For example, suppose a program, written in a dynamically typed array-based computing language, includes the following statements:

A='hello'
A=int32([1, 2])
A=[1.1, 2.2, 3.3]

Now suppose the program is executed, for example, in a TCE, such as TCE 520. During run-time, when the statement "A='hello'" is executed, the data type of variable "A" may be a string data type. Later when the statement "A=int32([1, 2])" is executed, the data type of variable "A" may be a 1-by-2 array containing elements whose data type are 32-bit integers. Later, when the statement "A=[1.1, 2.2, 3.3]" is executed, since the language is dynamically typed, the data type of variable "A" may be changed from the above 1-by-2 array to a 1-by-3 array containing floating-point elements. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

TCE 520 may provide mathematical routines and a high-level programming language suitable for non-professional programmers. TCE 520 may provide graphical tools that may be used for creating plots, surfaces, images, volumetric representations, or other representations. TCE 520 may provide these routines and/or tools using toolboxes (e.g., toolboxes for signal processing, image processing, data plotting, parallel processing, etc.). TCE 520 may also provide these routines in other ways, such as, for example, via a library, a local data structure, a remote data structure (e.g., a database operating in a computing cloud), a remote procedure call (RPC), and/or an application programming interface (API). TCE 520 may be configured to improve runtime performance when performing computing operations. For example, TCE 520 may include a just-in-time (JIT) compiler.

Server device 530 may include one or more devices capable of receiving, generating, storing, processing, and/or providing information associated with code. For example, server device 530 may include a computing device, such as a server, a desktop computer, a laptop computer, a tablet computer, or a similar device. In some implementations, server device 530 may host TCE 520. In some implementations, client device 510 may be used to access one or more TCEs 520 running on one or more server devices 530. For example, multiple server devices 530 may be used to execute program code (e.g., serially or in parallel), and may provide respective results of executing the program code to client device 510.

In some implementations, client device 510 and server device 530 may be owned by different entities. For example, an end user may own client device 510, and a third party may own server device 530. In some implementations, server device 530 may include a physical or virtual device operating in a cloud-computing environment. For example, service device 530 can be a virtual machine or application running on a cloud-computing platform. In this way, front-end applications (e.g., a user interface) may be separated from back-end applications (e.g., program code execution). Additionally, or alternatively, server device 530 may perform one, more, or all operations described elsewhere herein as being performed by client device 510.

Network 540 may include one or more wired and/or wireless networks. For example, network 540 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 5 are provided as an example. In practice, there may be additional devices and/or networks, fewer devices and/or networks, different devices and/or networks, or differently arranged devices and/or networks than those shown in FIG. 5. Furthermore, two or more devices shown in FIG. 5 may be implemented within a single device, or a single device shown in FIG. 5 may be implemented as multiple, distributed devices. Additionally, or alternatively, a set of devices (e.g., one or more devices) of environment 500 may perform one or more functions described as being performed by another set of devices of environment 500.

Figure 6:
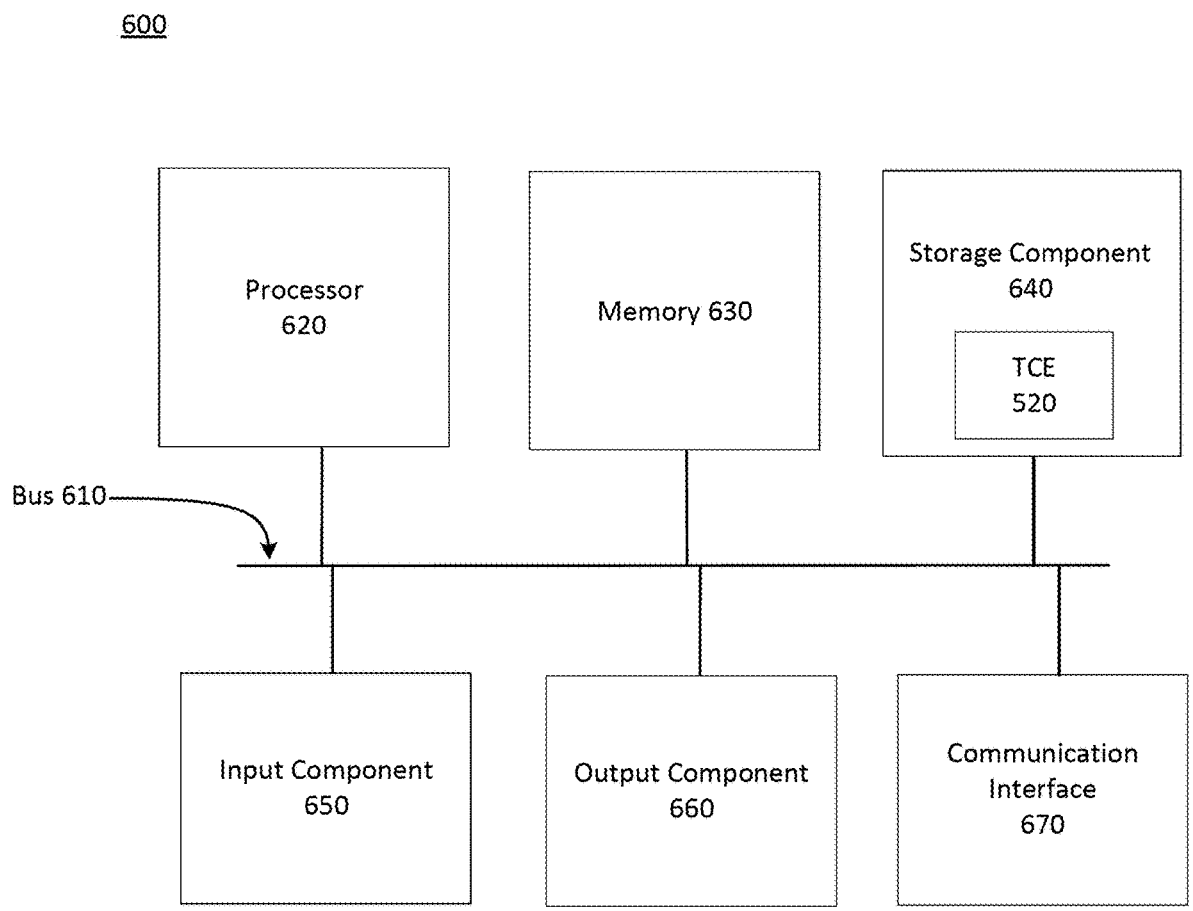
FIG. 6 depicts an exemplary device suitable for use consistent with the disclosed embodiments.

FIG. 6 depicts an exemplary device 600 suitable for use consistent with the disclosed embodiments. Device 600 may correspond to client device 510, server device 530, or a like device. In some implementations, client device 510, server device 530, or the like device may include at least one of device 600 or at least one component of device 600. As shown in FIG. 6, device 600 may include a bus 610, a processor 620, a memory 630, a storage component 640, an input component 650, an output component 660, and a communication interface 670.

Bus 610 can include a component that permits communication among the components of device 600. Processor 620 can be implemented in hardware, firmware, or a combination of hardware and software. Processor 620 can be a central processing unit (CPU), a graphics processing unit (GPU), a digital signal processor (DSP), an accelerated processing unit (APU), a microprocessor, a microcontroller, a field-programmable gate array (FPGA), an application-specific integrated circuit (ASIC), or another suitable processing component. In some implementations, processor 620 can include one or more processors capable of being programmed to perform a function. Memory 630 can include a random-access memory (RAM), a read-only memory (ROM), or another suitable dynamic or static storage device (e.g., a flash memory, a magnetic memory, and/or an optical memory) that stores information and/or instructions for use by processor 620.

Storage component 640 can store information and/or software related to the operation and use of device 600. For example, storage component 640 can include a hard disk (e.g., a magnetic disk, an optical disk, a magneto-optic disk, and/or a solid-state disk), a compact disc (CD), a digital versatile disc (DVD), a floppy disk, a cartridge, a magnetic tape, and/or another type of non-transitory computer-readable medium, along with a corresponding drive.

Input component 650 can include a component that permits device 600 to receive information, such as via user input (e.g., a touch screen display, a keyboard, a keypad, a mouse, a button, a switch, and/or a microphone). Additionally, or alternatively, input component 650 can include a sensor for sensing information (e.g., a global positioning system (GPS) component, an accelerometer, a gyroscope, and/or an actuator). Output component 660 can include a component that provides output information from device 600 (e.g., a display, a speaker, and/or one or more light-emitting diodes (LEDs)).

Communication interface 670 can include a transceiver-like component (e.g., a transceiver and/or a separate receiver and transmitter) that enables device 600 to communicate with other devices, such as via a wired connection, a wireless connection, or a combination of wired and wireless connections. Communication interface 670 can permit device 600 to receive information from another device and/or provide information to another device. For example, communication interface 670 can include an Ethernet interface, an optical interface, a coaxial interface, an infrared interface, a radio frequency (RF) interface, a universal serial bus (USB) interface, a Wi-Fi interface, a cellular network interface, or the like.

Device 600 can be configured to perform one or more processes described herein. Device 600 may perform these processes (e.g., a computer-implemented method) in response to processor 620 executing software instructions stored by a non-transitory computer-readable medium, such as memory 630 or storage component 640. A computer-readable medium can be a non-transitory memory device. A memory device can include memory space within a single physical storage device or memory space spread across multiple physical storage devices.

Software instructions can be read into memory 630 or storage component 640 from another computer-readable medium or from another device via communication interface 670. When executed, software instructions stored in memory 630 or storage component 640 can cause processor 620 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 6 are provided as an example. In practice, device 600 can include additional components, fewer components, different components, or differently arranged components than those shown in FIG. 6. Additionally, or alternatively, a set of components (e.g., one or more components) of device 600 may perform one or more functions described as being performed by another set of components of device 600.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware, but systems and methods consistent with the present disclosure can be implemented with hardware and software. In addition, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. A system for design validation, comprising:

a validation computing device configured to:

obtain a dataset and a record of user interactions, the record of user interactions including modifications of options for a design, the design options specified by a rule set that implements a standard, the modifications of the design options including:

a first modification of a first design option, and a first justification of the first modification, provide a validation interface that includes, at least in part:

a design option indicator configured to display the first modification, a justification indicator configured to display the first justification, a visualization display that depicts a first visualization of the dataset corresponding to the first design option, and a validation control that enables a first rejection of the first modification, and store, in a record of reviewer interactions, the first rejection; and a designer computing device configured to:
obtain the record of reviewer interactions;
display the first rejection; and
provide a design interface for:
revising the first modification; or
revising the first justification of the first modification.

2. The system of claim 1, wherein:
the dataset comprises tabular data, image data, or natural language processing data.

3. The system of claim 1, wherein:
the dataset includes a tabular dataset, and the first design option includes:
including, transforming, or excluding a row or column of the tabular dataset.

4. The system of claim 1, wherein:
the first design option includes:
modifying outlier values or replacing missing values in the dataset; or
applying a transformation to at least a portion of the dataset.

5. The system of claim 1, wherein:
the design comprises a model for prediction, inference, classification, or detection and the first design option includes selecting:
portions of the dataset as inputs to the model; or
a model type, model architecture, or model segmentation.

6. The system of claim 1, wherein:
the design comprises a program and the first design option includes an assertion that a program assumption is satisfied, the program assumption dependent on the dataset.

7. The system of claim 1, wherein:
the record of reviewer interactions comprises the record of user interactions;
the validation computing device is configured to store the first rejection in association with the first modification.

8. A system for design validation, comprising:
a designer computing device configured to:
obtain a dataset and a rule set that implements a standard;
provide a design interface configured to enable modifications of options for a design, the design options specified by the rule set, the design interface including, at least in part:
a selection control configured to enable a first modification of a first design option;
a justification control configured to enable provision of a first justification for the first modification; and
a visualization display that depicts a first visualization of the dataset corresponding to the first design option; and
store, in a record of user interactions, the first modification and the first justification;
a validation computing device configured to:
obtain the record of user interactions;
display a validation interface that includes:
a depiction of the first modification, the first justification, and the first visualization; and
a validation control configured to enable a first rejection of the first modification; and
store, in a record of reviewer interactions, the first rejection.

9. The system of claim 8, wherein:
the designer computing device is further configured to predetermine the first modification by applying the rule set to the dataset; and
the selection control is configured to enable, as the first modification, acceptance or rejection of the predetermined first modification.

10. The system of claim 8, wherein:
the designer computing device is further configured to predetermine the first justification by applying the rule set to the dataset; and
the justification control is configured to enable, as the provision of the first justification, acceptance or replacement of the predetermined first justification.

11. The system of claim 8, wherein:
the justification control is configured to enable a selection of an alternative justification, as a replacement of the predetermined first justification, from a set of predetermined justifications specified by the rule set.

12. The system of claim 8, wherein:
the design comprises a model for prediction, inference, classification, or detection;
the model is trained using, at least in part, training data generated from the dataset; and
the rule set specifies design options for modifying the dataset or the model.

13. A design validation method, comprising:
obtaining a dataset and a rule set that implements a standard;
developing a design, development comprising:
modifying, by at least one first user, design options specified by the rule set using, at least in part, a design graphical user interface that displays, for a first design option and a set of currently selected design options:
a first visualization corresponding to the first design option, the first visualization depicting at least one of:
a portion of the dataset as modified by a first subset of selected design options;
descriptive information for the portion of the dataset; or
a first application of the design, as specified by a second subset of the selected design options, to the dataset as modified by the first subset of the selected design options;
a control for modifying the first design option; and
a control for providing a first justification for a first modification of the first design option;
validating, by at least one second user, the modifications of the design options using, at least in part, a validation graphical user interface that displays, for the first design option:
the first visualization;
the first justification; and
a validation control for accepting or rejecting the first modification; and
reverting, by a first one of the at least one first user, the first modification when the first modification is rejected by the at least one second user; and
deploying the design.

14. The method of claim 13, wherein:
a second one of the at least one first user modifies the design options in a first order; and
the modified design options are displayed by the validation graphical user interface to the at least one second user in the first order.

15. The method of claim 13, wherein:
the method further comprises obtaining a category for each of the design options based, at least in part, on the rule set; and
the development further comprises displaying, to the at least one second user, an overview graphical user interface that depicts a subset of the design options, the subset of the design options corresponding to a subset of the categories.

16. The method of claim 15, wherein:
the method further comprises interacting, by a first one of the at least one second user, with the overview graphical user interface to select the first modification for validation; and
the validation control for accepting or rejecting the first modification is displayed by the validation graphical user interface in response to the selection of the first modification for validation.

17. The method of claim 13, wherein:
the validation graphical user interface displays, for the first design option, a control for selecting an alternative design option; and
the method further comprises:
selecting, by a first one of the at least one second user and using the control for selecting the alternative design option, the alternative design option; and
displaying, by the validation graphical user interface, a third visualization corresponding to a third design option, the third visualization depicting:
a second portion of the dataset as modified by at least the alternative design option;
description information for the second portion of the dataset; or
a third application of the design to the dataset as specified by at least the alternative design option; or
displaying, by an overview graphical user interface, a categorization of the third design option based at least in part on the alternative design option.

18. The method of claim 13, wherein:
the method further comprises reviewing a design after deployment of the design, reviewing comprising:
obtaining a second dataset;
reviewing, by a third user, the modifications of the design options using, at least in part, the validation graphical user interface, the validation user interface displaying, for the first design option:
a second visualization corresponding to the first design option, the second visualization depicting at least one of:
a portion of the second dataset as modified by a third subset of the selected design options;
descriptive information for the portion of the second dataset; or
an application of the design, as specified by a fourth subset of the selected design options, to the second dataset as modified by the third subset of the selected design options.

19. The method of claim 13, wherein:
the development further comprises:
during a first development stage:
modifying, using the design graphical user interface, data preprocessing design options; and
validating, using the validation graphical user interface, the modifications of the data preprocessing design options;
after validation of the modifications of the data preprocessing design options, during a second development stage:
modifying, using the design graphical user interface, design input options; and
validating, using the validation graphical user interface, the modifications of the design input options.

20. The method of claim 19, wherein:
the design comprises a model for prediction, inference, classification, or detection; and
the development further comprises:
during a third development stage:
modifying, using the design graphical user interface, design options concerning model type, model architecture, or model segmentation; and
validating, using the validation graphical user interface, the modifications of the design options concerning model type, model architecture, or model segmentation.

21. The method of claim 13, wherein:
deploying the model includes automatically generating code implementing the design; and
executing or interpreting the code.

* * * * *